(12) United States Patent
Narita et al.

(10) Patent No.: US 9,609,795 B2
(45) Date of Patent: Mar. 28, 2017

(54) METHOD OF SUPPLYING SOLDER TO PRINTED CIRCUIT BOARD

(71) Applicant: YAMAHA HATSUDOKI KABUSHIKI KAISHA, Shizuoka-ken (JP)

(72) Inventors: Yoshitaka Narita, Shizuoka (JP); Takeshi Fujimoto, Shizuoka (JP); Hidetoshi Sato, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 545 days.

(21) Appl. No.: 13/962,773

(22) Filed: Aug. 8, 2013

(65) Prior Publication Data

US 2014/0115874 A1 May 1, 2014

(30) Foreign Application Priority Data

Oct. 31, 2012 (JP) ................................. 2012-241095

(51) Int. Cl.
*G01R 31/28* (2006.01)
*H05K 13/04* (2006.01)
(Continued)

(52) U.S. Cl.
CPC ..... *H05K 13/0465* (2013.01); *B41F 15/0881* (2013.01); *B41F 15/42* (2013.01); *B41F 15/423* (2013.01); *B41P 2215/50* (2013.01); *H05K 3/1233* (2013.01); *H05K 3/3484* (2013.01); *Y10T 29/49004* (2015.01); *Y10T 29/49155* (2015.01); *Y10T 29/532* (2015.01)

(58) Field of Classification Search
CPC .. H05K 3/1233; H05K 3/3484; H05K 3/1216; H05K 3/0008; H05K 3/3478; H05K 2203/0139; B23K 2201/42; B41F 15/44; B41P 2215/50; Y10T 29/49155; Y10T 29/532
USPC ........ 29/846, 593, 745, 825, 829; 228/8, 11, 228/17, 22, 33, 102, 248.1
See application file for complete search history.

(56) References Cited

U.S. PATENT DOCUMENTS 8,342,381 B2 * 1/2013 Sumioka ............. B41F 15/0881
228/102
2012/0138664 A1 6/2012 Sumioka

FOREIGN PATENT DOCUMENTS

CN 1746026 A 3/2006
JP H05-200975 A 8/1993
(Continued)

OTHER PUBLICATIONS

An Office Action issued by the Korean Patent Office on Sep. 17, 2014, which corresponds to Korean Patent Application No. 10-2013-0093572 and is related to U.S. Appl. No. 13/962,773; with English language summary.
(Continued)

*Primary Examiner* — Thiem Phan
(74) *Attorney, Agent, or Firm* — Studebaker & Brackett PC

(57) ABSTRACT

Provided is a solder supply method of supplying, onto a mask sheet, solder to be printed on a printed circuit board. The method includes calculating an amount of solder supplied for a plurality of points in an X direction that is a lengthwise direction of a squeegee, and changing the amount of solder supplied at each point in the X direction based on a result of the calculation.

10 Claims, 21 Drawing Sheets

(51) Int. Cl.
      *B41F 15/08*      (2006.01)
      *B41F 15/42*      (2006.01)
      *H05K 3/34*       (2006.01)
      *H05K 3/12*       (2006.01)

(56) References Cited

FOREIGN PATENT DOCUMENTS

| | | |
|---|---|---|
| JP | 07-205403 A | 8/1995 |
| JP | H09-201943 A | 8/1997 |
| JP | 2009-241286 A | 10/2009 |

OTHER PUBLICATIONS

The extended European search report issued on Jan. 3, 2014, which corresponds to EP13003597.5-1704 and is related to U.S. Appl. No. 13/962,773.

\* cited by examiner

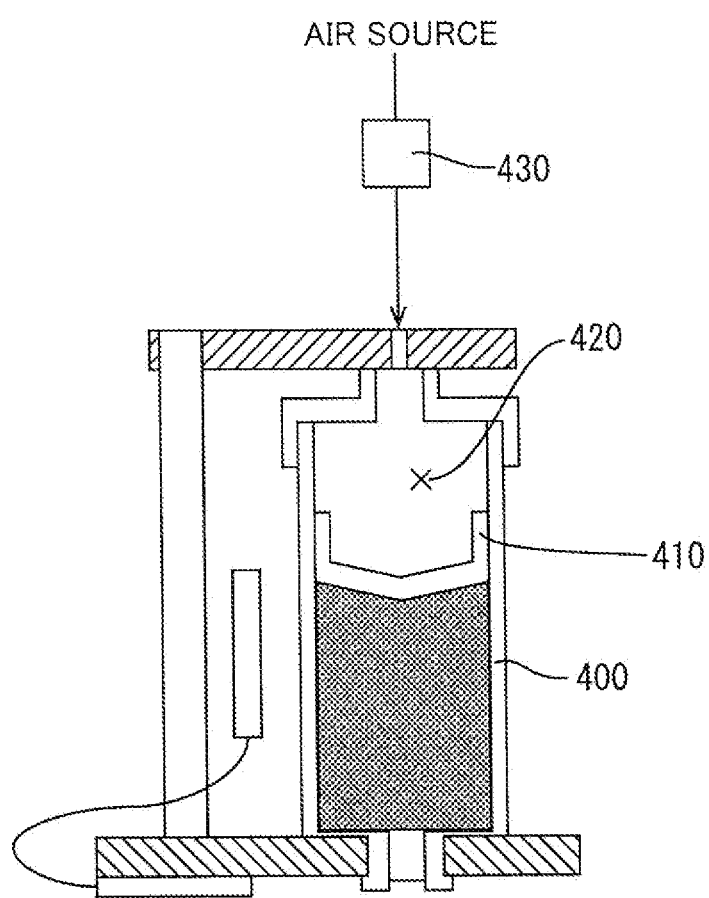

METHOD OF SUPPLYING SOLDER TO PRINTED CIRCUIT BOARD

BACKGROUND OF THE INVENTION

Field of the Invention

The present invention relates to a technique for supplying solder to a mask sheet.

Description of the Background Art

Japanese Patent Application Laid-Open No. H7-205403 discloses an apparatus which constantly detects the rolling diameter of cream solder during a process of printing the cream solder to determine the insufficiency or excess of the amount of the cream solder and which, in the case of insufficiency, replenishes the amount of cream solder equivalent to the insufficiency, and in the case of excess, removes the excess amount of cream solder.

However, the area of openings formed in a mask sheet varies at each point in an X direction that is a lengthwise direction of a squeegee, and thus, the amount of decrease in solder amount associated with the printing process varies at each point in the X direction. The apparatus adjusts the amount of solder by determining the insufficiency or excess of the solder amount using the measurement result obtained at only one measurement position. Thus, the apparatus fails to sufficiently adjust the amount of solder at another position where the measurement is not carried out.

Furthermore, if the moving range of a head is short compared to the length of the squeegee, making the amount of solder supplied uniform at each point in the X direction disadvantageously increases the number of solder rolling operations. Thus, there has been a demand for measures against this problem.

SUMMARY OF THE INVENTION

An object of the present invention is to allow the amount of solder to be more accurately adjusted and to reduce the number of rolling operations.

To accomplish the object, an aspect of the present invention provides a solder supply method of supplying, onto a mask sheet, solder to be printed on a printed circuit board, the method including:

calculating an amount of solder supplied for a plurality of points in an X direction that is a lengthwise direction of a squeegee; and changing the amount of solder supplied at each point in the X direction based on a result of the calculation.

Furthermore, another aspect of the present invention provides a solder supply apparatus that supplies, onto a mask sheet, solder to be printed on a printed circuit board, the apparatus including:

a calculation unit that calculates an amount of solder supplied for a plurality of points in an X direction that is a lengthwise direction of a squeegee; and a change unit that changes the amount of solder supplied at each point in the X direction based on a result of the calculation by the calculation unit.

BRIEF DESCRIPTION OF THE DRAWINGS

FIG. 22 is a cross-sectional view showing another example of the solder supply head.

DESCRIPTION OF THE PREFERRED EMBODIMENTS

Embodiment 1

A printing apparatus 10 according to Embodiment 1 of the present invention will be described with reference to FIG. 1 to FIG. 13.

1. General Configuration of the Printing Apparatus

The printing apparatus 10 according to Embodiment 1 slides a squeegee 50 on a mark sheet 100 to print cream solder on a printed circuit board U through openings 105 formed in the mask sheet 100. In the description below, a longitudinal direction of the squeegee 50 is referred to as an X direction. A direction in which the squeegee 50 moves is referred to as a Y direction. Furthermore, a vertical direction is referred to as a Z direction.

Figure 1:
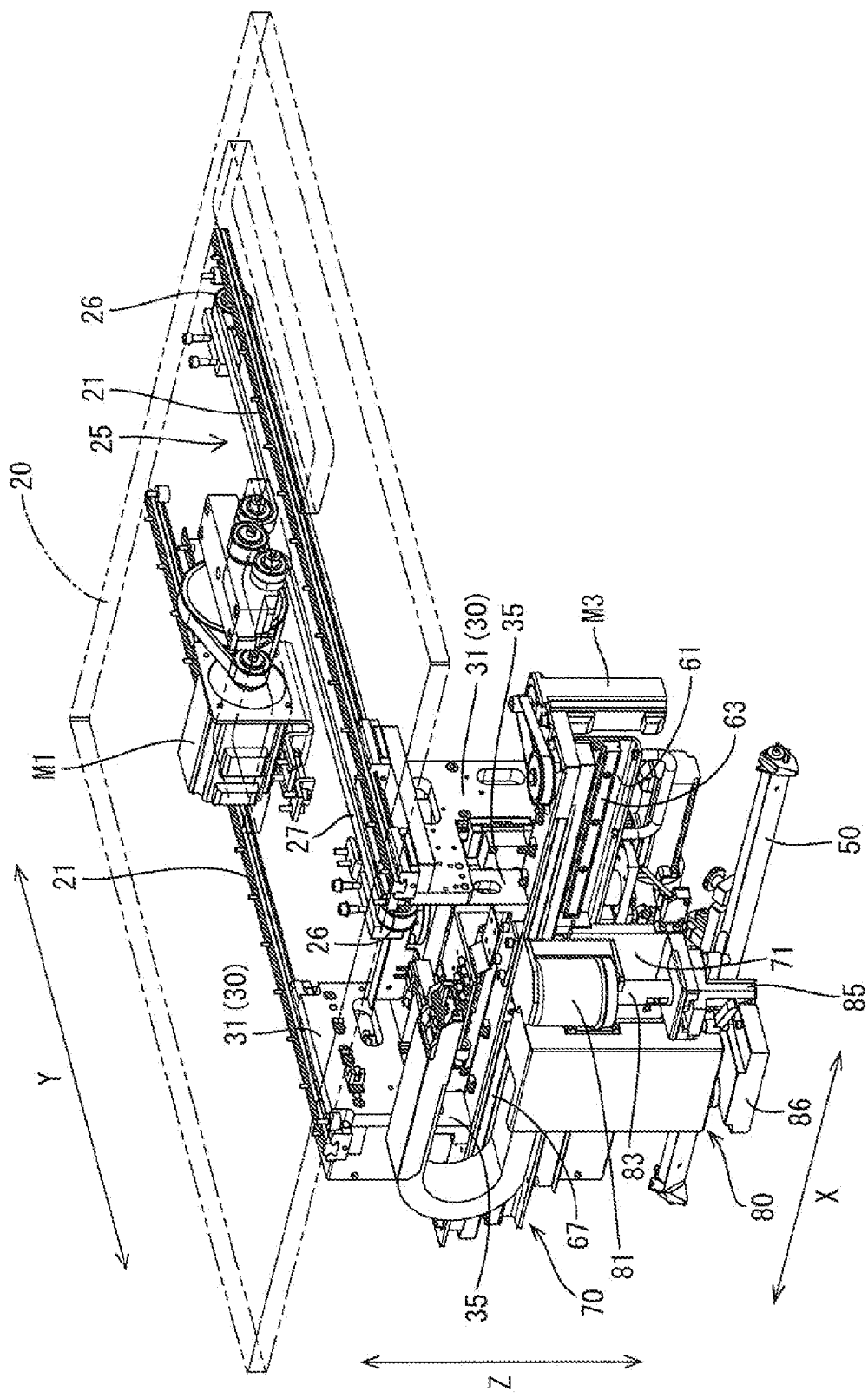
FIG. 1 is a perspective view of a printing apparatus according to Embodiment 1 of the present invention.
Figure 2:
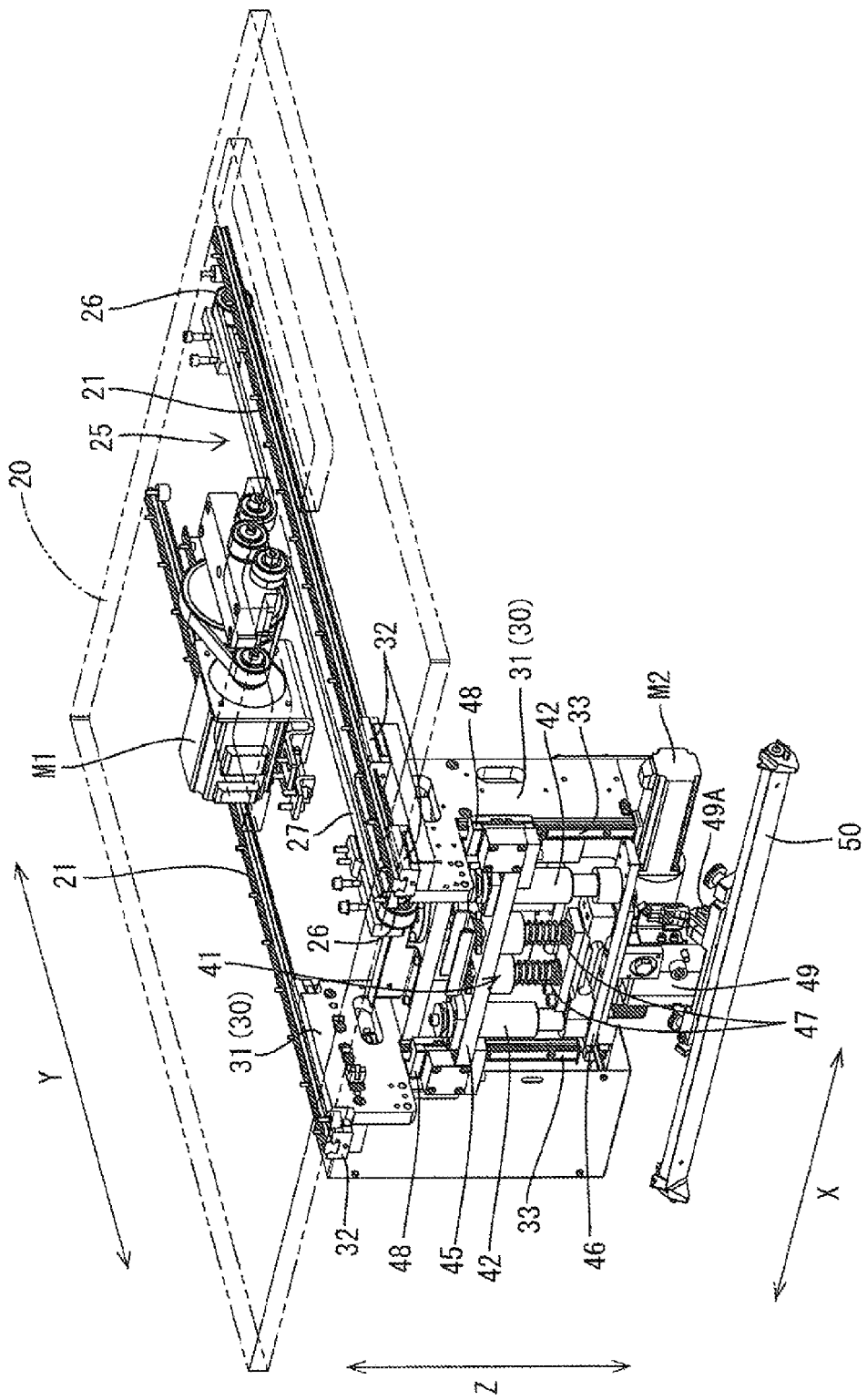
FIG. 2 is a perspective view showing a printing apparatus with a solder supply unit removed therefrom.
Figure 3:
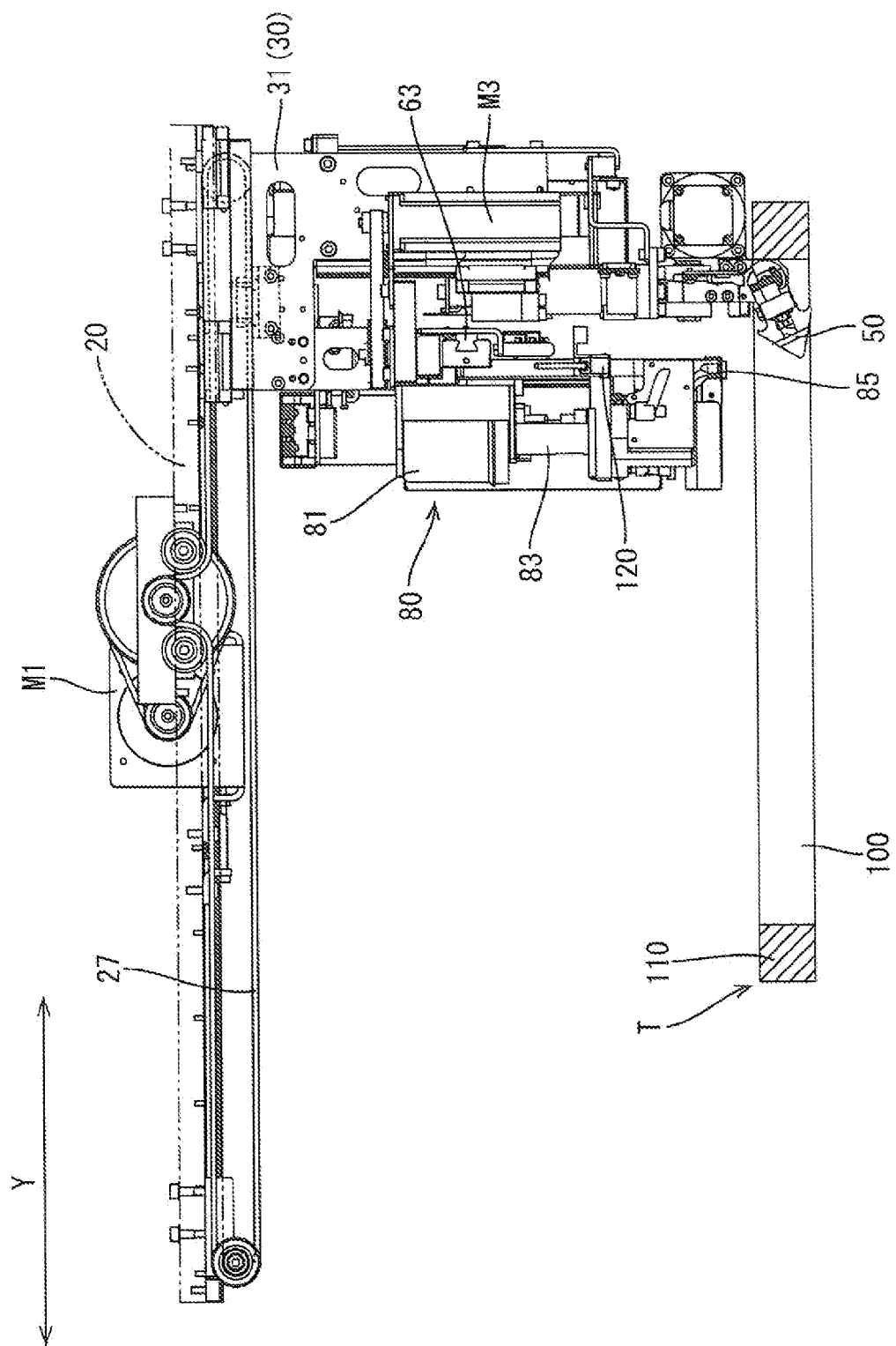
FIG. 3 is a cross-sectional view of the printing apparatus.

The printing apparatus 10 is of a hanging type and hangs a first support frame 30 that supports the squeegee 50 from a ceiling wall 20 of a housing. As shown in FIG. 1 and FIG. 2, a pair of Y rails 21 is attached to the ceiling wall 20. The Y rails 21 are spaced from each other in the X direction and extend parallel to each other in the Y direction. The first support frame 30 is slidably attached to each of the Y rails 21.

Specifically, the first support frame 30 includes a lateral (X direction) pair of side walls 31 coupled together by a coupling wall (not shown in the drawings). Y sliders 32 are fixed to the lateral pair of side walls 31, respectively. The Y sliders 32 are slidably fitted in the Y rails 21.

A belt transmission apparatus 25 provided inside the Y rail 21 shown forward in FIG. 1 and FIG. 2. The transmission apparatus 25 includes a longitudinal (Y direction) pair of pulleys 26 and a belt member 27 wound on the pulleys 26. Driving a servo motor M1 cyclically moves the belt member 27 in the Y direction. The first support frame 30 is fixed to the belt member 27 via a coupling portion (not shown in the drawings). Driving the servo motor M1 allows the squeegee 50 attached to the first support frames 30 to be moved in the Y direction along the Y rails 21.

As shown in FIG. 2, the squeegee 50, which is shaped to be elongate in the X direction, is fixed to the first support frames 30 via a suspension mechanism section 41 so as to be movable in the vertical direction. The suspension mechanism section 41 includes a vertical (Z direction) pair of support plates 45 and 46, a pair of guide shafts 42 that supports both the support plates 45 and 46 so that the support plates 45 and 46 can be relatively displaced, and coil springs 47 provided between the support plates 45 and 46. The squeegee 50 is fixed to a bottom portion of the suspension mechanism section 41. The squeegee 50 is shaped to be elongate in the X direction. The squeegee 50 is coupled to a support section 49 fixed to a bottom portion of the support plate 46 via a hinge 49A and rotates about a shaft of the hinge 49A.

Z rails 33 are attached to the respective right and left side walls 31 forming the first support frames 30. The Z rails 33 extend parallel to each other in the Z direction. Z sliders 48 provided in the suspension mechanism section 41 are slidably fitted over the Z rails 33, respectively. In the above-described configuration, driving a servo motor M2 fixed to the bottom portion of the first support frame 30 allows the squeegee 50 to be moved vertically along the Z rails 33 together with the suspension mechanism section 41.

The description continues with reference again to FIG. 1. A solder supply unit 70 is attached to front sides of the first support frames 30 via a second support frame 61. The second support frame is shaped to be elongate in the X direction. The second support frame 61 is fixed to the lateral pair of side walls 31 via stays 35.

Figure 4:
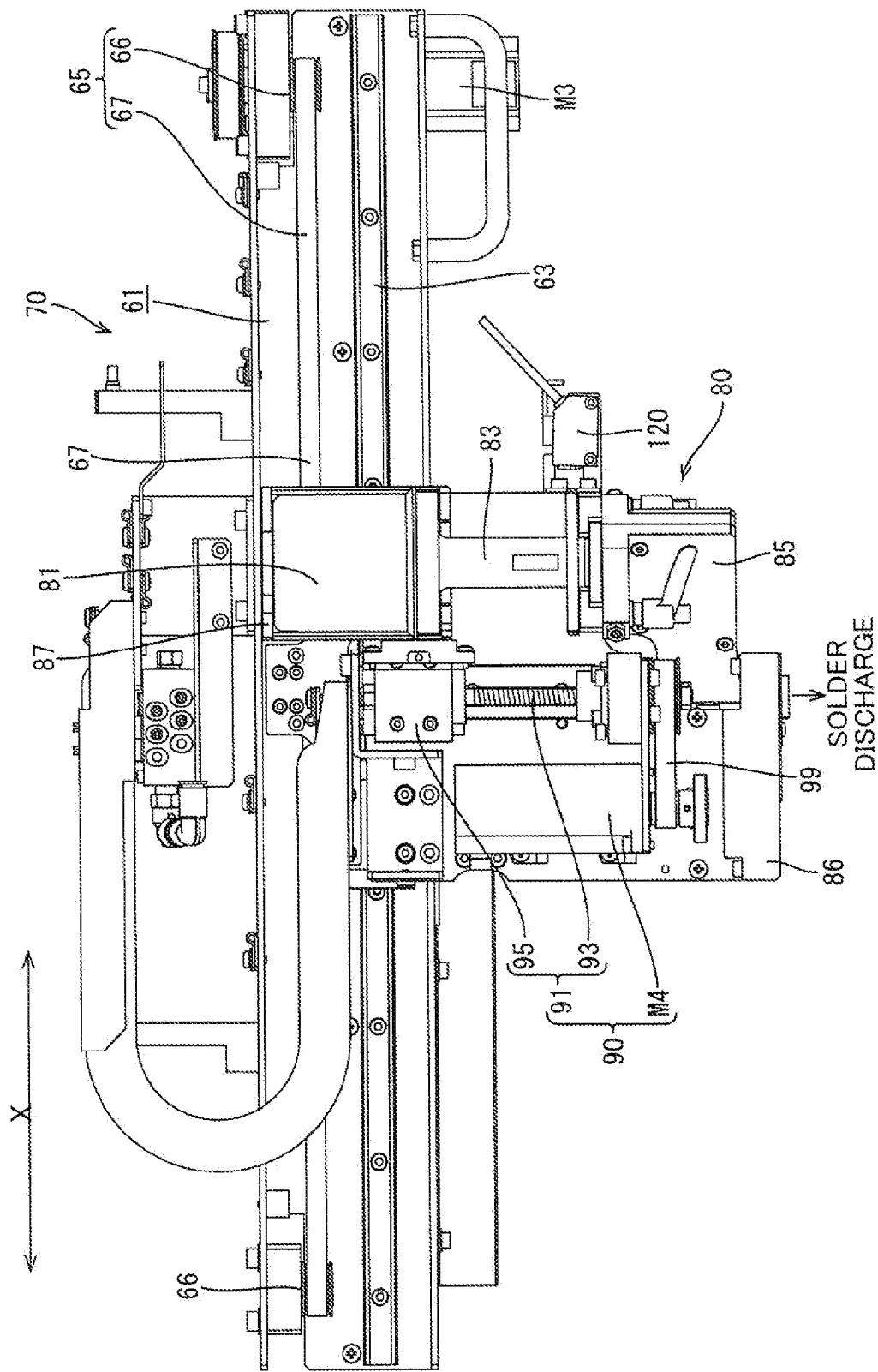
FIG. 4 is a front view of the solder supply unit.
Figure 5:
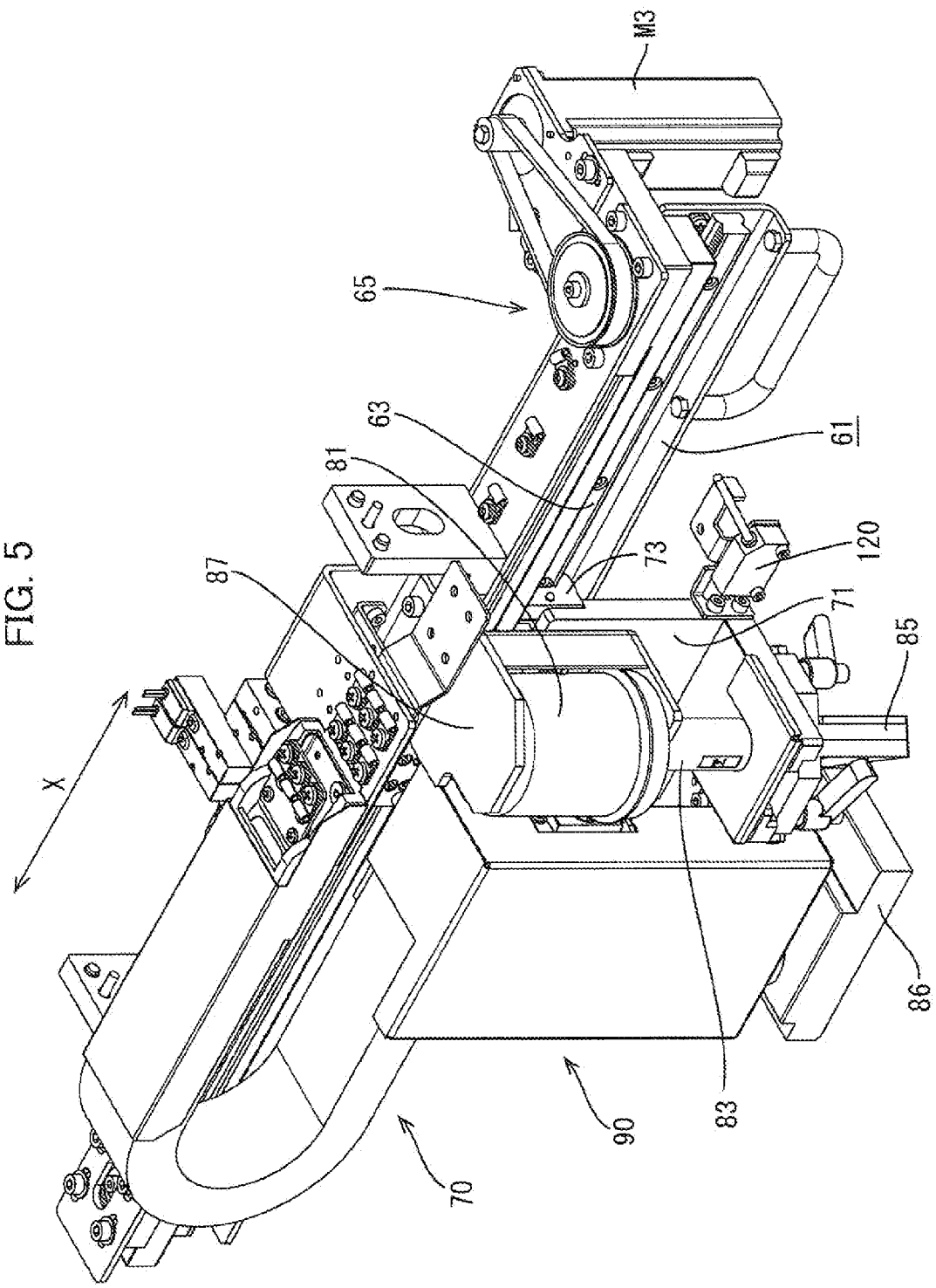
FIG. 5 is a perspective view of the solder supply unit.

As shown in FIG. 4 and FIG. 5, an X rail 63 extending horizontally in the X direction is fixed to the center of the second support frame 61. A support base 71 that supports a solder supply head 80 is slidably fitted over the X rail 63 via an X slider 73.

A belt transmission apparatus 65 is provided over the X rail 63. The belt transmission apparatus 65 includes a lateral pair of pulleys 66 and a belt member 67 wound on the pulleys 66. Driving a servo motor M3 cyclically moves the belt member 67 in the X direction. A support base 71 is fixed to the belt member 67 via a coupling portion (not shown in the drawings). Driving the servo motor M3 allows the solder supply head 80 to be moved in the X direction along the X rail 63 together with the support base 71.

Figure 6:
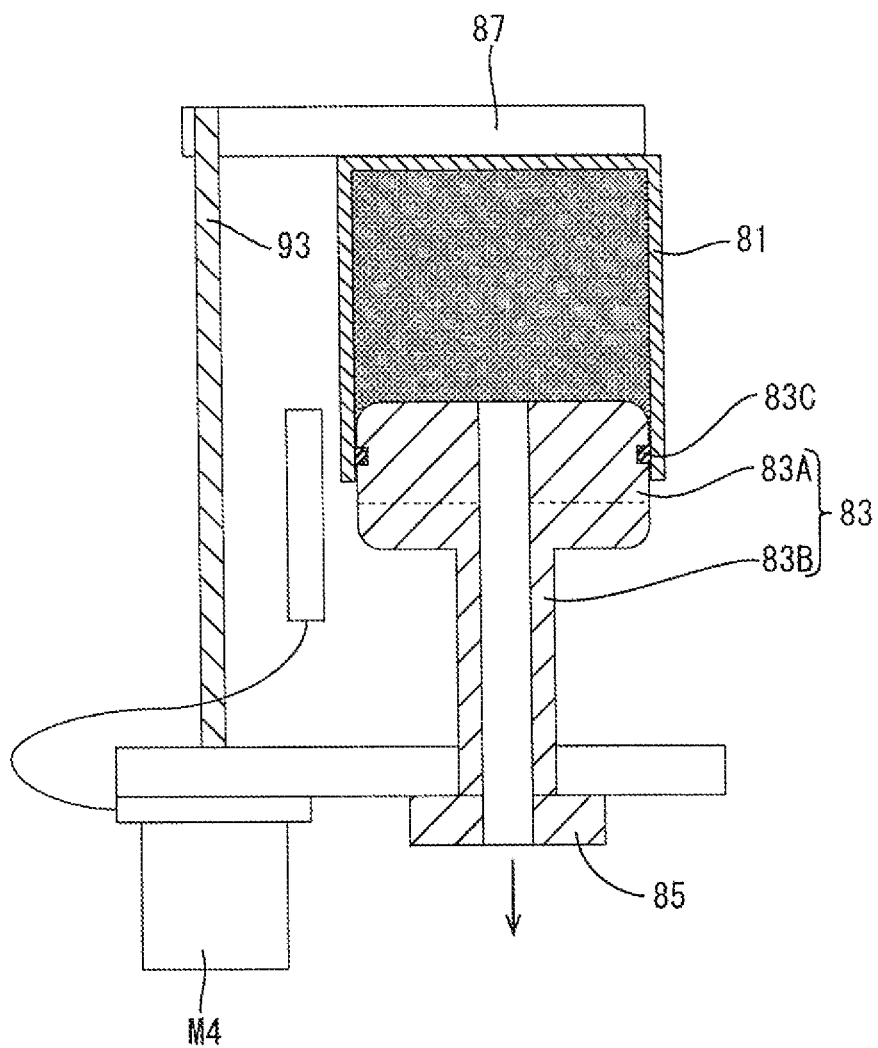
FIG. 6 is a schematic diagram showing a solder supply structure in the solder supply unit.

As shown in FIG. 4, the solder supply head 80 includes a housing pot 81, a discharge adapter 83, a nozzle 85 attached to the tip of the discharge adapter 83, a pressure member 87 that presses the housing pot 81 downward, and a drive section 90. The housing pot 81 is shaped like a cylinder with an open bottom surface and houses cream solder. The discharge adapter 83 includes a disk-like piston 83A fitted in the bottom surface of the housing pot 81 without any space, and a discharge pipe 83B provided at the bottom of the piston. A seal member 83C is attached to an outer peripheral portion of the piston 83A to provide a seal between the piston 83A and the housing pot 81 (see FIG. 6). FIG. 6 is a schematic diagram of the solder supply head 80.

The drive section 90 includes a servo motor M4 and a ball screw mechanism 91. The ball screw mechanism 91 includes a screw shaft 93 extending in the vertical direction and arranged in a lateral direction with respect to the servo motor M4. A belt 99 is passed between the servo motor M4 and the screw shaft 93 so that power from the servo motor M4 is transmitted to the ball screw mechanism 91 via the belt 99.

The ball screw mechanism 91 converts the power of the servo motor M4 into power acting in the direction of the screw shaft, that is, in the vertical direction, to move a linear motion member 95 fixed to the pressure member 87 in the vertical direction. When the drive section 90 is actuated to lower the pressure member 87, the housing pot 81 is pressed by the pressure member 87 and displaced downward to reduce the distance from a ceiling surface of the housing pot 81 and the piston 83A. Thus, cream solder is pushed out of the housing pot 81 and discharged through the tip of the nozzle 85 via the discharge pipe 83B (see FIG. 6). A member shown at reference numeral 86 in FIG. 4 and FIG. 5 is a solder cutter that cuts cream solder discharged through the nozzle 85.

As shown in FIG. 5, a detection sensor (an example of a "measurement section" according to the present invention) 120 is attached to the support base 71 via a bracket. The detection sensor 120 is attached to the support base 71 with a detection surface thereof facing downward. The detection sensor 120 is, for example, a reflective optical sensor and detects the presence or absence of cream solder supplied onto the mask sheet 100 based on the level of a light reception signal resulting from reception of reflected light from a surface of the mask sheet. The printing apparatus 10 uses the detection sensor 120 to detect the line between the presence and absence of cream solder, thus measuring the solder width Wp (see FIG. 11) of the cream solder.

Figure 8:
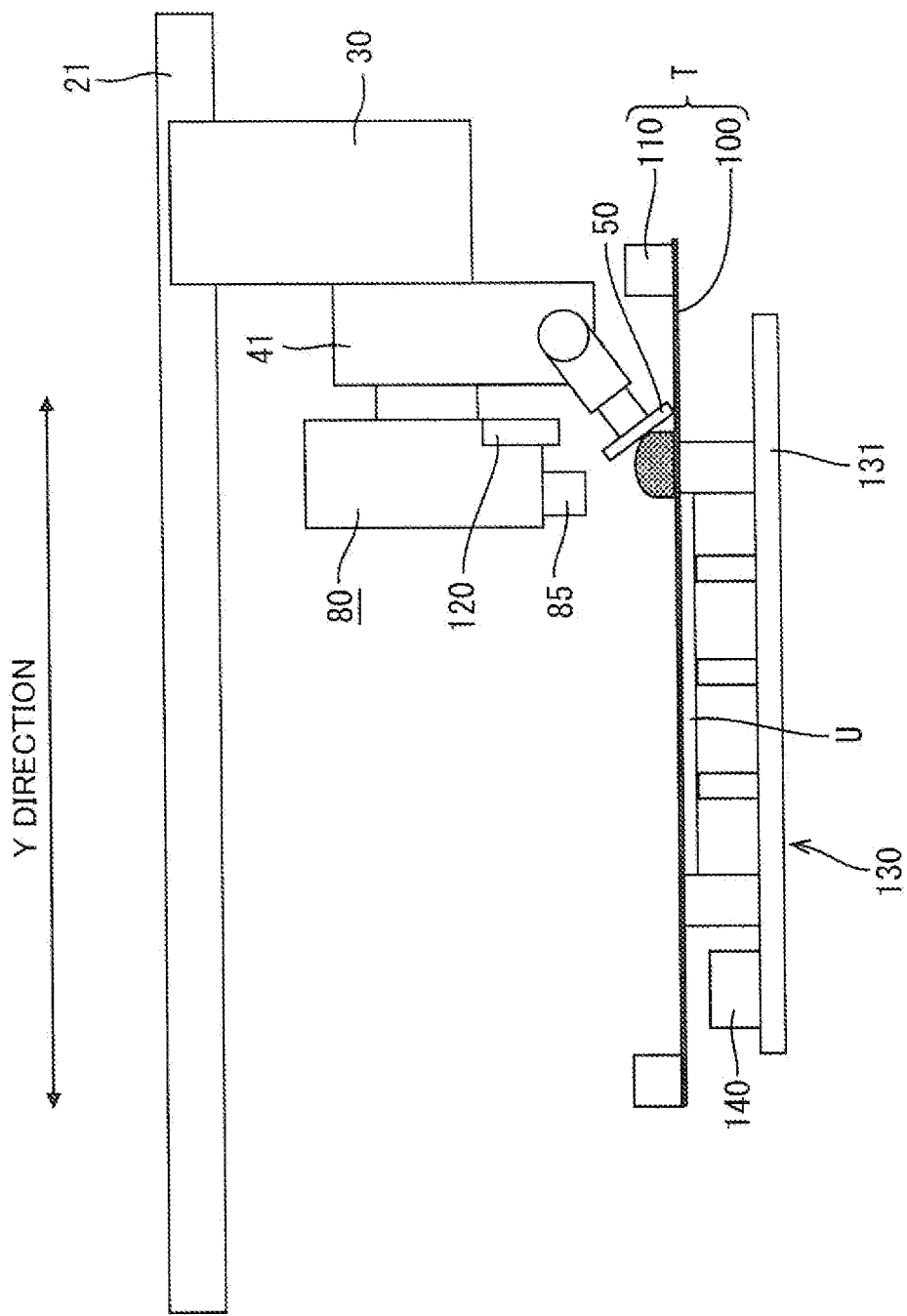
FIG. 8 is a side view showing a printing operation of a solder supply head.
Figure 9:
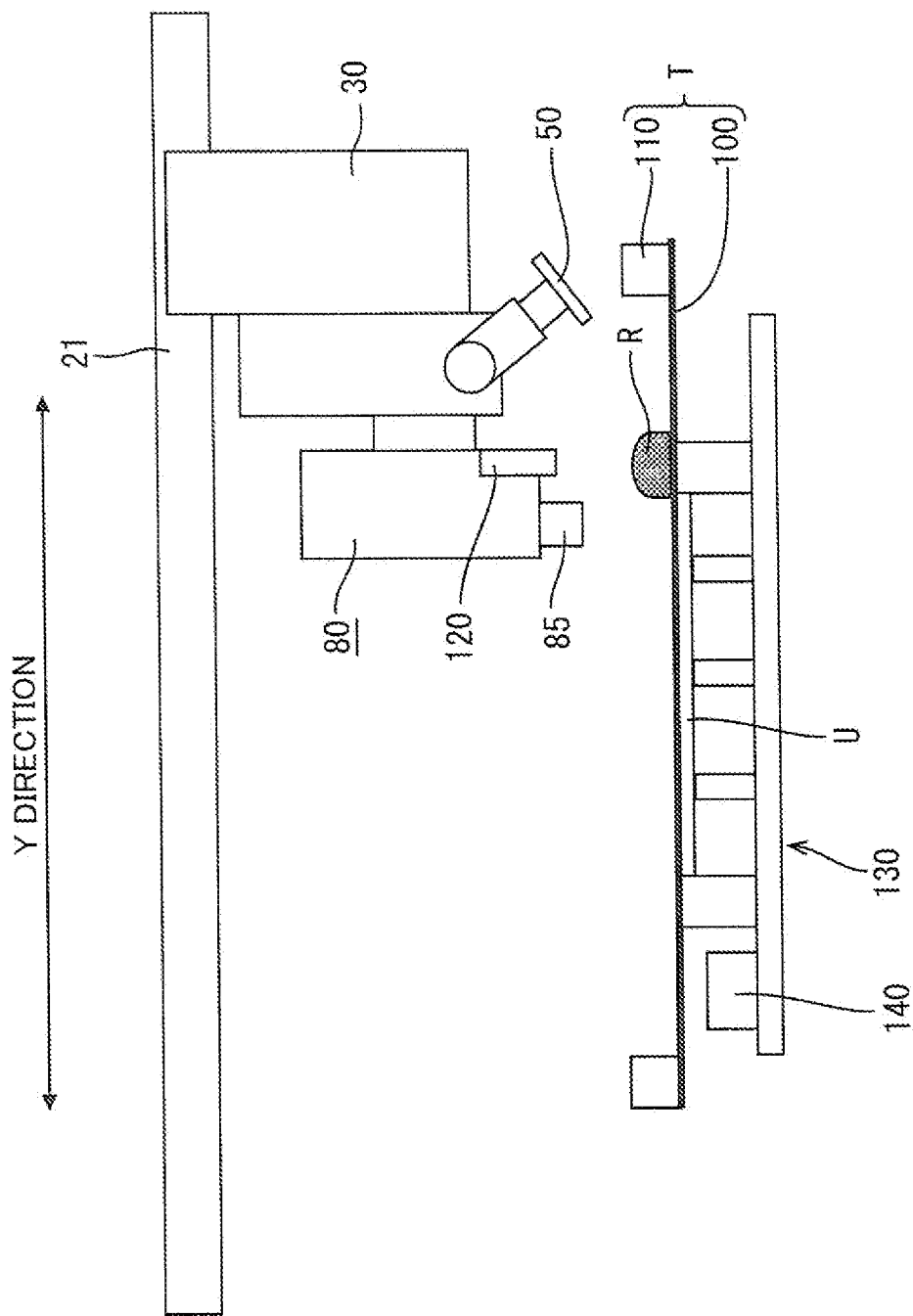
FIG. 9 is a side view of the solder supply unit in a state after a printing process.

A print mask T is mounted below the squeegee 50 via a mask sheet holding apparatus not shown in the drawings (see FIG. 8). The print mask T includes a mask frame 110 that is a metallic square pipe formed like a frame and the mask sheet 100 fixed to a bottom surface side of the mask frame 110 via a tensioner. The mask sheet (stencil) 100 is structured to include a thin flat plate with a large number of openings 105 formed therein and through which cream solder is printed on the printed circuit board.

Figure 7:
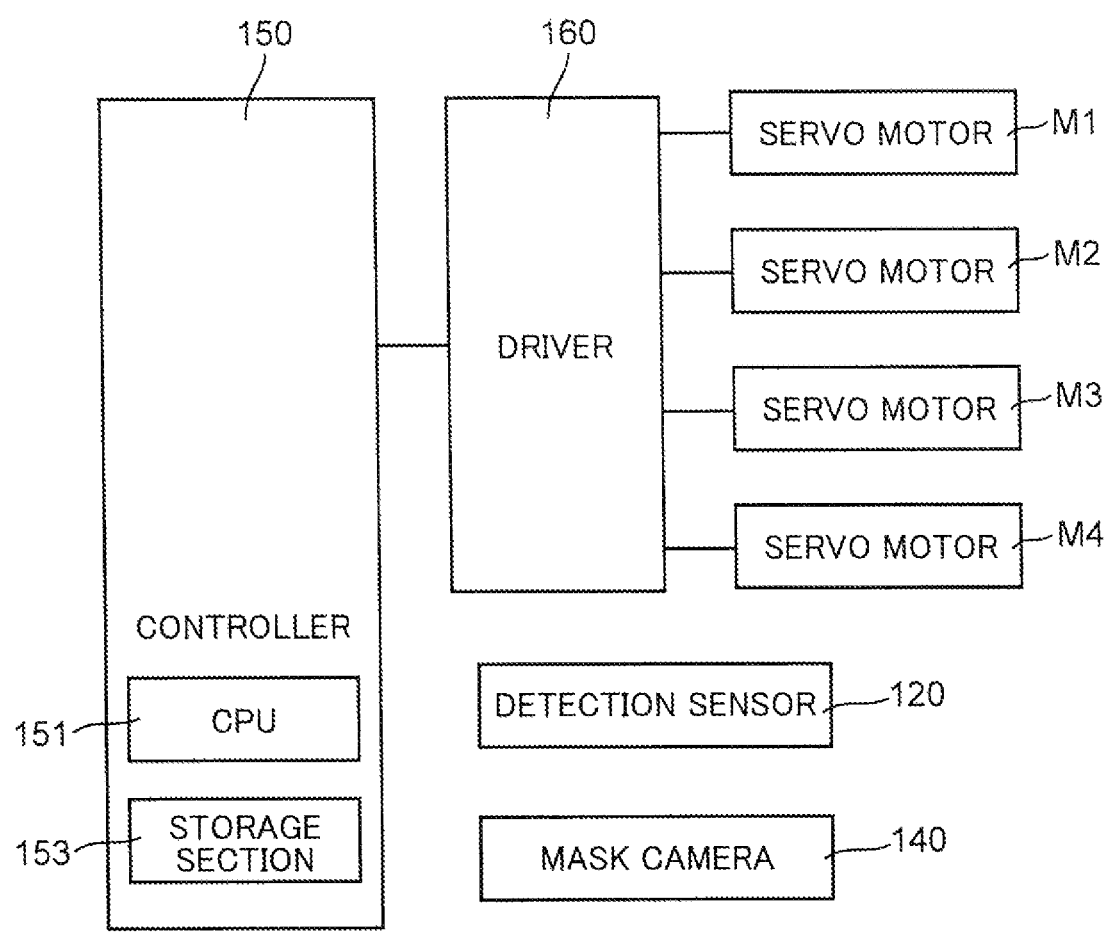
FIG. 7 is a block diagram showing an electric arrangement for the printing apparatus.

Now, an electric arrangement for the printing apparatus 10 will be described with reference to FIG. 7. The printing apparatus 10 includes a controller 150, a motor driver 160, a detection sensor 120, and a mask sheet camera 140. Servo motors M1 to M4 are electrically connected to the motor driver 160. The controller 150 includes a CPU 151 and a storage section 153. The controller 150 provides a function to control the servo motors M1 to M4 through the motor driver 160 to control movement of the squeegee 50 (the control of movement in the Y direction and the Z direction), movement of the solder supply head 80 (the control of movement in the X direction and the Y direction), and the amount of supplied cream solder. The storage section 153 stores an operation program for executing a replenishment sequence for cream solder described below, and data for use in executing the replenishment sequence for cream solder. The controller 150 is an example of a "calculation unit" and a "change unit" according to the present invention.

A mask sheet camera 140 takes an image of the mask sheet 100. The mask sheet camera 140 is mounted, for example, on a support base 131 of a circuit board support apparatus 130 with an image taking surface of the camera 140 facing upward. The mask sheet camera 140 takes an image of the mask sheet 100 to enable the state of the mask sheet 100 (whether or not the opening 105 portions have been elongated or deformed) to be detected.

2. Description of a Printing Operation

The printing apparatus 10 lays a printed circuit board U conveyed by the circuit board support apparatus 130 on a bottom surface of the mask sheet 100 via an elevating and lowering apparatus (not shown in the drawings). The printing apparatus 10 then discharges cream solder from the nozzle 85 of the solder supply head 80 and supplies the cream solder onto a front surface of the mask sheet 100. For example, the cream solder is supplied in line form along the X direction.

After cream solder is supplied, the squeegee 50 is lowered onto the mask sheet 100. Subsequently, as shown in FIG. 8, the squeegee 50 is slid on the front surface of the mask sheet 100 while being moved in the Y direction. The movement of the squeegee 50 spreads the cream solder over the mask sheet 100 while being pressed by the squeegee 50 and is filled in the openings 105 formed in the mask sheet 100. Thus, the cream solder can be printed on the printed circuit board U laid on the back surface of the mask sheet 100 (printing process).

3. Method for Supplying Cream Solder

Figure 10:
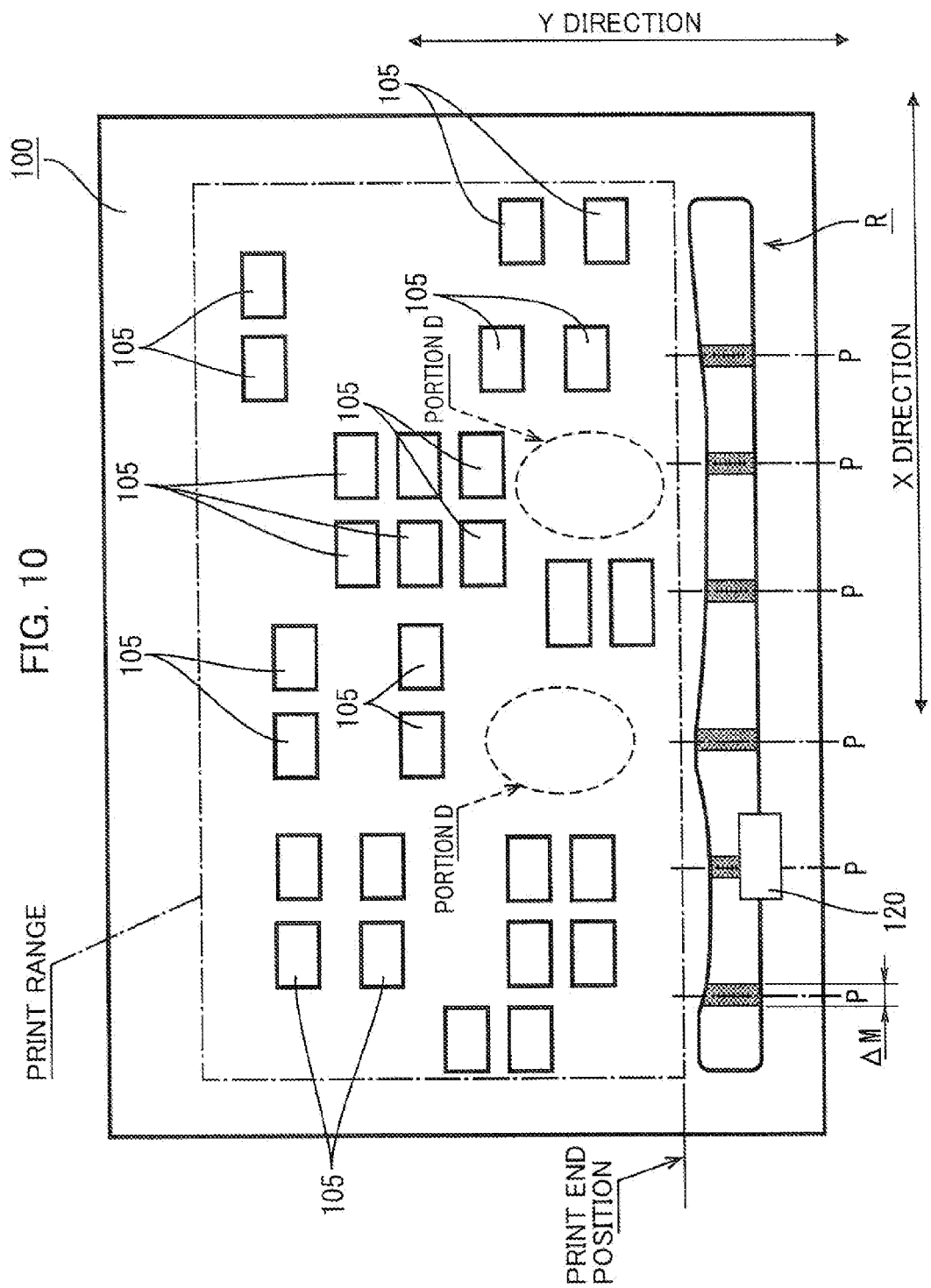
FIG. 10 is a plan view of a mask sheet in a state after the printing process.
Figure 11:
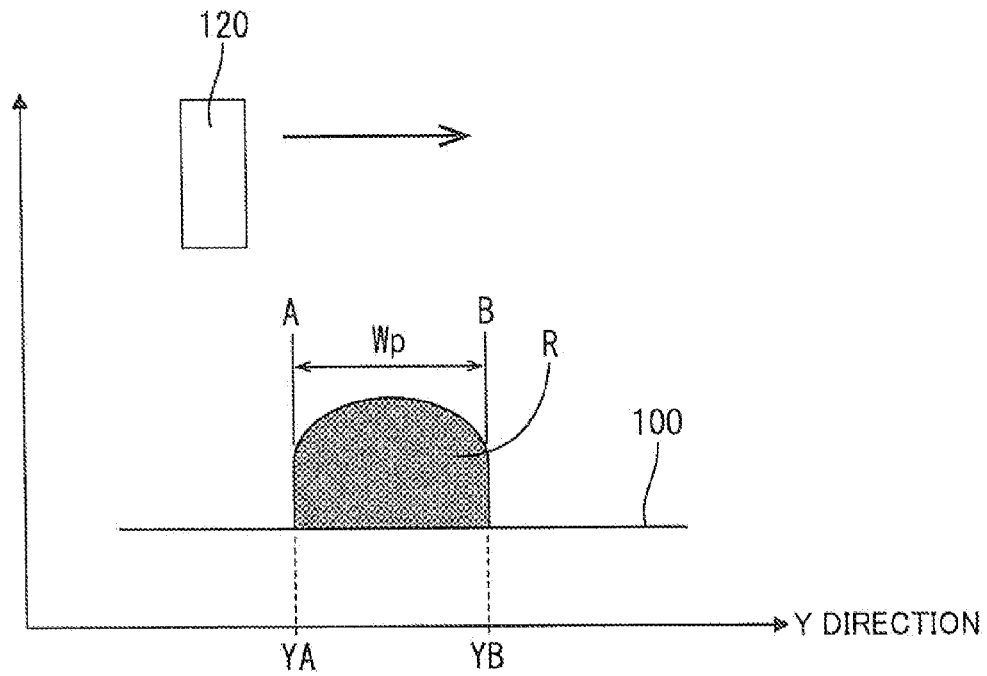
FIG. 11 is a diagram illustrating a method for measuring a solder width.

The amount of cream solder supplied onto the mask sheet 100 before the printing process is normally larger than the amount of cream solder filled in the openings 105 in association with a printing process. Thus, after the printing process is finished, an amount of cream solder having failed to be filled in the openings 105 during the printing process remains near a print end position on the mask sheet 100 (an end of the mask sheet 100 in the Y direction). The cream solder having failed to be filled in the openings 105 (hereinafter referred to as the remaining solder) R is shaped like a line that is elongate in the X direction and to have a generally inverse-U-shaped cross section as shown in FIG. 10. If the amount of solder R remaining on the mask sheet 100 is smaller than a predetermined reference amount, cream solder needs to be supplied (replenished) before a process of printing the next printed circuit board is carried out.

To replenish cream solder after the process of printing cream solder is finished, the printing apparatus 10 first uses the detection sensor 120, mounted on the solder supply head 80, to carry out a process of measuring the solder width (the width in the Y direction) Wp of the remaining solder R, at a plurality of points in the X direction (measurement process). Then, the amount Xp of supplied solder at each measurement point P in the X direction is calculated based on the measured solder width Wp (calculation process). Subsequently, based on the calculated amount Xp of supplied solder at each measurement point P, the distribution of the amount of solder supplied in the X direction is calculated. The amount Xp of supplied solder at each point in the X direction is then changed in accordance with the calculated distribution of the amount of solder supplied (change process).

The above-described process enables the accuracy of adjustment for cream solder (replenishment accuracy) to be improved. That is, the area of the openings 105 formed in the mask sheet 100 varies at each point in the X direction, and thus, the amount of decrease in solder amount associated with the printing process varies at each point in the X direction. The printing apparatus 10 calculates the amount of solder supplied at each measurement point P in the X direction, and changes the amount of solder supplied at each point. Thus, cream solder can be supplied according to the amount of decrease in solder amount at each point in the X direction, enabling the accuracy of adjustment for cream solder to be improved.

The following processes will be described below: the measurement process of measuring the solder width (the width in the Y direction) Wp of the remaining solder R, the calculation process of calculating the amount Xp of supplied solder at each measurement point P in the X direction based on the measured solder width Wp, and the change process of changing the amount of solder supplied at each point in the X direction in accordance with the distribution of the amount Xp of supplied solder.

Figure 13:
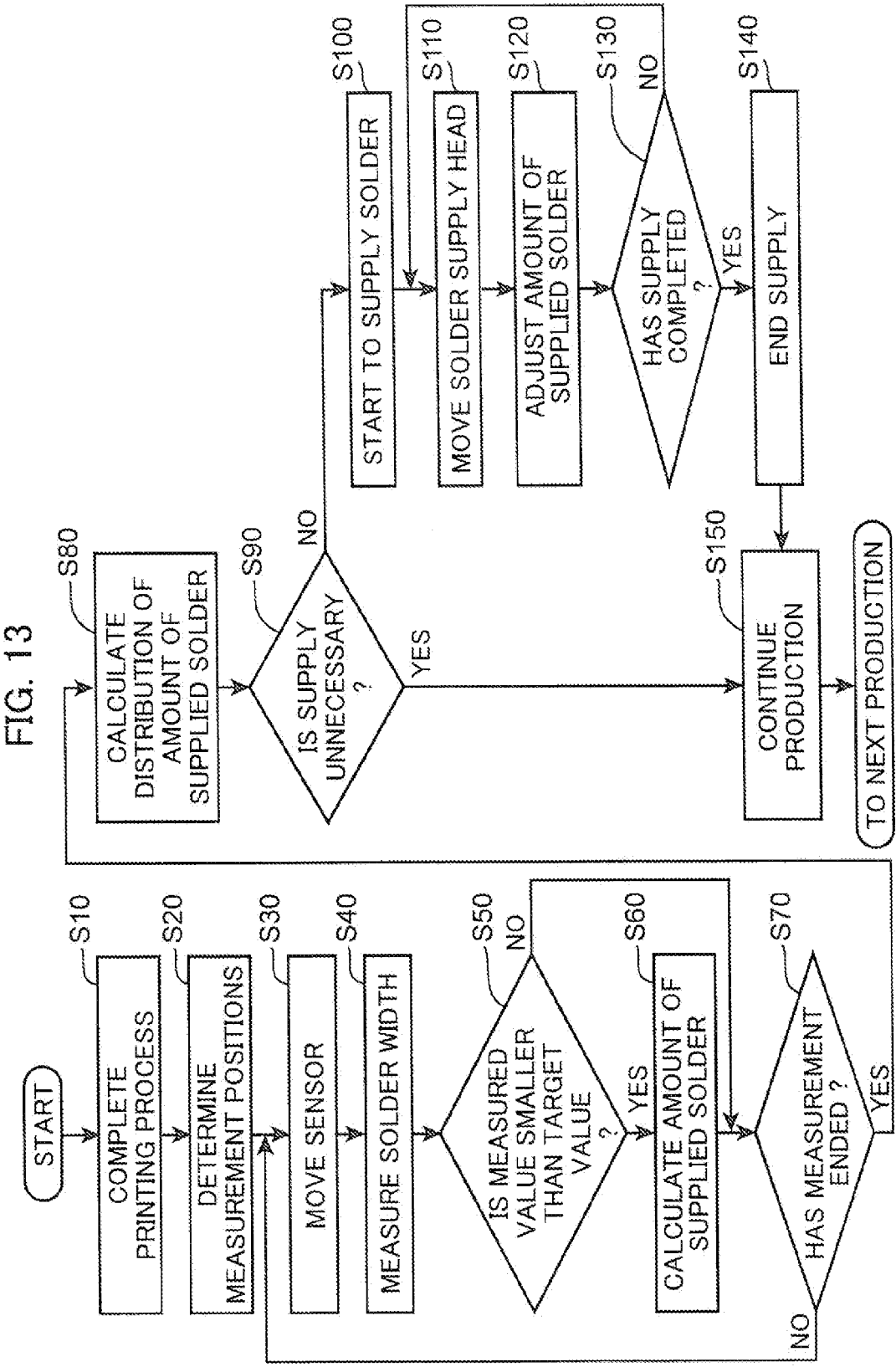
FIG. 13 is a flowchart showing a flow of a process for a replenishment sequence for cream solder.

(A) Measurement Process (Steps S20 to S40 in FIG. 13)

The measurement process involves passing the detection sensor 120 over the remaining solder R while moving the detection sensor 120 in the Y direction to detect the presence or absence of the remaining solder R. Then, the difference between the coordinates of a detection start position for the remaining solder R and the coordinates of a detection end position for the remaining solder R is calculated to measure the solder width Wp of the remaining solder R at the measurement position P. For example, if the detection sensor 120 detects the remaining solder R from a position "A" to a position "B" shown in FIG. 11, the Y coordinate "YA" of the position "A", the detection start position, is subtracted from the Y coordinate "YB" of the position "B", the detection end position, as indicated by Formula (1) below, to measure the solder width Wp. The printing apparatus 10 carries out such a measurement process at a plurality of measurement points by varying the measurement position P.

$$Wp=|YB-YA|$$ Formula (1)

In this formula, the solder width of the remaining solder R at the measurement position P is denoted by "Wp". The coordinate of the detection start position for the remaining solder R is denoted by "YA". The coordinate of the detection end position for the remaining solder R is denoted by "YB".

Furthermore, the measurement position P is preferably a place where any of the following measurement conditions is met.

(1) A point where a change in the length, in the Y direction, of the opening 105 formed in the mask sheet 100 is small;

(2) A point where the opening 105 formed in the mask sheet 100 has the largest length in the Y direction;

(3) A point where the opening 105 formed in the mask sheet 100 has the smallest length in the Y direction; and (4) A point where the opening 105 formed in the mask sheet 100 has a generally average length in the Y direction.

Figure 12:
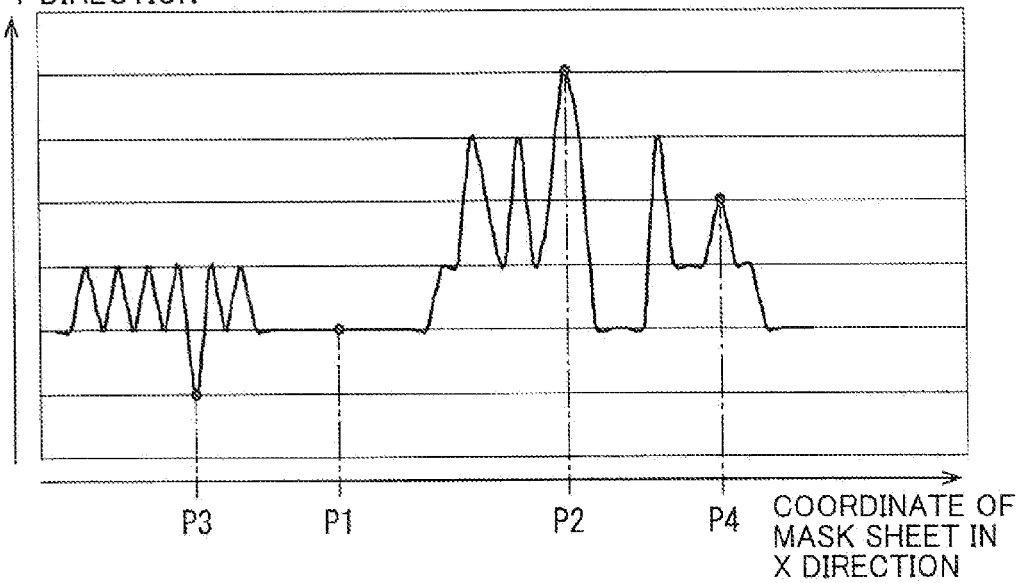
FIG. 12 is a graph showing the transition of the length of an opening in a Y direction.

FIG. 12 is a graph showing the transition of the length of the opening 105 in the Y direction, where the axis of abscissas indicates the X-direction coordinate on the mask sheet 100, and the axis of ordinate indicates the Y-direction coordinate on the opening 105. For example, in the example illustrated in FIG. 12, preferred measurement positions are a coordinate P1 where a change in the length, in the Y direction, of the opening 105 is small, a coordinate P2 where the opening 105 has the largest length in the Y direction, a coordinate P3 where the opening 105 has the smallest length in the Y direction, and a coordinate P4 where the opening 105 has a generally average length in the Y direction. If a plurality of openings 105 is present in the Y direction, the "length of the opening 105 in the Y direction" refers to the total length of the plurality of openings 105. Furthermore, the "small change" means that a change in the length of the opening 105 in the Y direction is small relative to the X direction.

Setting the above-described points to be measurement positions P allows a variation in the solder width Wp in the X direction to be accurately detected. To carry out a measurement process, the printing apparatus 10 first determines measurement positions P that conform to the conditions (1) to (4) described above (predetermined measurement conditions) based on inspection data on the mask sheet 100 (data resulting from examination of the positions, shapes, sizes, and the like of the openings 105 formed on the mask sheet 100).

Alternatively, places where the opening 105 has a long distance from the print end position may be selected as measurement positions P, for example, portions D enclosed by a dashed frame in FIG. 10. If the opening 105 has a long distance from the print end position, the remaining solder R is spread and leveled off by the squeegee 50 after the squeegee 50 passes the opening 105 and before the squeegee 50 reaches the print end position. Thus, advantageously, stable data on the solder width Wp is acquired.

(B) Calculation Process (S60)

The calculation process involves calculating the amount of solder supplied at each measurement position P by performing an arithmetic operation of substituting the solder width Wp of the remaining solder R, measured in the measurement process, into Formula (2) shown below on each measurement position P.

$$Xp=((Wt/2)\times(Wt/2)-(Wp/2)\times(Wp/2))\times\pi\times D\times\Delta M \quad \text{Formula (2)}$$

The amount of solder supplied at the measurement position P is denoted by "Xp".

A target value for the solder width is denoted by "Wt".

The shape ratio of the remaining solder R to a perfect circle (area ratio) is denoted by "D".

A unit length in the X direction is denoted by $\Delta M$ (see FIG. 10).

(C) Change Process (S120)

The change process is carried out when the solder supply head 80 supplies cream solder to the remaining solder R, and involves adjusting the rotation speed of the servo motor M4 to change the amount Xp of supplied solder at each point in the X direction according to the amount Xp of supplied solder calculated in the calculation process. That is, in order to increase the amount Xp of supplied solder, the rotation speed of the servo motor M4 is increased. The increased rotation speed of the servo motor M4 increases the speed at which the pressure member 87 presses the housing pot 81, raising a discharge pressure for the cream solder. Thus, the amount Xp of supplied solder can be increased. On the other hand, in order to reduce the amount Xp of supplied solder, the rotation speed of the servo motor M4 is reduced. The reduced rotation speed of the servo motor M4 decreases the speed at which the pressure member 87 presses the housing pot 81, lowering the discharge pressure for the cream solder. Thus, the amount Xp of supplied solder can be reduced. Hence, when the amount Xp of supplied solder is adjusted by the rotation speed of the servo motor M4, the adjustment can advantageously be achieved without reducing the speed of the solder supply head 80.

Furthermore, the method for changing the amount Xp of supplied solder may involve adjusting the moving speed of the solder supply head 80 (the moving speed in the X direction) instead of changing the rotation speed of the servo motor M4 described above. That is, in order to increase the amount Xp of supplied solder, the moving speed of the solder supply head 80 is reduced with the amount of solder discharged through the nozzle 85 maintained constant. In contrast, in order to reduce the amount Xp of supplied solder, the moving speed of the solder supply head 80 is increased with the amount of solder discharged through the nozzle 85 maintained constant. If the amount Xp of supplied solder is adjusted by the moving speed of the solder supply head 80, the amount Xp of supplied solder can advantageously be adjusted simply by regulating the speed.

4. Replenishment Sequence for Cream Solder

Now, a replenishment sequence for cream solder will be described with reference to FIG. 13. The printing apparatus 10 starts an automatic operation, and when the first printing process is completed, the remaining solder R remains near the print end position as shown in FIG. 10 (S10). The printing process is a process of reciprocating the squeegee 50 on the mask sheet 100 in the Y direction (that is, the print start position is the same as the print end position) to carry out printing on one or more printed circuit boards U.

In S20, a process of determining the measurement position P for the solder width Wp is carried out by the controller 150. Specifically, an image of the mask sheet 100 taken with the mark sheet camera 140 before the printing process is analyzed, and the distribution of the Y-direction length of the opening 105 in the mask sheet is calculated (see FIG. 12). Then, based on the calculated distribution, a plurality of points (for example, 10 points) which conforms to the above-described conditions (1) to (4) is extracted, and the extracted points are determined to be measurement positions.

Data on the openings 105 formed in the mask sheet 100 can be acquired from the image data on the mask sheet 100 taken with the mask sheet camera 140 or from design data or inspection data on the mask sheet 100.

When the measurement positions are determined in S20, the process shifts to S30. In S30, the controller 150 carries out a process of moving the detection sensor 120 to each of the measurement positions. In the process in the step S30 carried out for the first time, the controller 150 carries out a process of moving the detection sensor 120 to the X coordinate of the first measurement position. The detection sensor 120 is mounted on the solder supply head 80, and can thus be moved to a target position by driving the servo motor M3 to move the solder supply head 80 in the X direction.

When the detection sensor 120 reaches the X coordinate of the first measurement position, the process shifts to S40. In S40, the detection sensor 120 is used to carry out a process of measuring the solder width Wp of the remaining solder R at the first measurement position P. Specifically, with the servo motor M1 driven to move the solder supply head 80 in the Y direction, the detection sensor 120 is passed over the remaining solder R to detect the presence or absence of the remaining solder R. Then, the difference between the coordinate of the detection start position for the remaining solder R and the coordinate of the detection end position for the remaining solder R is calculated to obtain the solder width Wp of the remaining solder R.

Subsequently, the process shifts to S50. In S50, the controller 150 carries out a process of determining whether or not the solder width Wp of the remaining solder R measured in S40 is smaller than the target value. The target value is the optimum value of the solder width which is optimum for the printing process, and is stored in, for example, the storage section 153. If the solder width Wp of the remaining solder R is smaller than the target value (solder needs to be replenished), an affirmative determination is made in S50 and the process shifts to S60.

In S60, the controller 150 carries out a process of calculating the amount Xp of supplied solder. The method for calculating the amount Xp of supplied solder is as described above. The amount Xp of supplied solder is calculated by substituting the solder width Wp calculated in S40 into Formula (2) described above. Here, the process in S60 calculates the amount Xp of supplied solder at the first measurement position P. Subsequently, the process shifts to S70. The process in S60 carried out by the controller 150 implements the processing function of the "calculation unit" according to the present invention. Furthermore, if the determination in S50 is negative, the process shifts to S70 without carrying out the process (the process of calculating the amount of supplied cream) in S60.

In S70, the controller 150 carries out a process of determining whether or not the solder width Wp has been measured at all the measurement positions P. At this stage, measurement has been carried out only at the first measurement position P, and thus, a negative determination is made in S70. If a negative determination is made in S70, the process returns to S30 to carry out a process of moving the detection sensor 120 to the second measurement position P.

Subsequently, a process is carried out which involves measuring the solder width Wp at the second measurement position P using the detection sensor 120. Moreover, the amount Xp of supplied solder is determined from the measured solder width Wp. Such a process is carried out on each measurement position P, and when the amount Xp of supplied solder is calculated for all the measurement positions P, an affirmative determination is made in S70.

When an affirmative determination is made in S70, the process shifts to S80. In S80, the controller 150 calculates the distribution of the amount Xp of supplied solder in the X direction based on the amount Xp of supplied solder at each measurement position P. Subsequently, the process shifts to S90, and the controller 150 carries out a process of determining whether or not solder supply is necessary. If the controller 150 determines that solder supply is unnecessary (for example, if the solder width is generally close to the target value at each point in the X direction), the process shifts to S150 to start to carry out a printing process on the next circuit board.

On the other hand, if the controller 150 determines that solder supply is necessary, the process shifts to S100 to start a process of supplying cream solder to the remaining solder R on the mask sheet 100. Specifically, the position of the solder supply head 80 is adjusted such that the position of the nozzle 85, through which solder is discharged, coincides with one end (for example, the left end in FIG. 10) of the remaining solder R in the X direction. Subsequently, cream solder is replenished by moving the solder supply head 80 toward the other end (for example, the right end in FIG. 10) of the remaining solder R in the X direction while discharging the cream solder from the tip of the nozzle 85. At this time, the controller 150 adjusts the rotation speed of the servo motor M4 according to the distribution of the amount Xp of supplied solder calculated in S80 to adjustably increase or reduce the amount Xp of supplied solder at each point in the X direction (S110 and S120). For the amount Xp of supplied solder in places other than the measurement positions P (the places where the solder width Wp is not measured), the average value of the amounts Xp of supplied solder for the respective measurement positions P is applied. This is because the amount of decrease in cream solder is assumed to be generally average for the places other than the measurement positions P. The process in S120, carried out by the controller 150, implements the processing function of the "change unit" according to the present invention.

When the nozzle 85 of the solder supply head 80 moves to the other end (the right end in FIG. 10), an affirmative determination is made in S130. Subsequently, the process shifts to S140, and the controller 150 carries out a process of stopping the movement of the solder supply head 80 and a process of stopping the supply of cream solder. Thereafter, the process shifts to S150 to start to carry out a printing process on the next circuit board.

5. Description of Advantages

As described above, the printing apparatus 10 changes the amount Xp of supplied solder at each point in the X direction according to the solder width Wp at each point in the X direction. Thus, the amount of solder is accurately adjusted, allowing a generally uniform amount of solder to be supplied onto the mask sheet 100. If the amount of solder is not uniform, a nonuniform pressure is applied to the cream solder when the cream solder is spread and printed using the squeegee 50. Specifically, the pressure is lower in places where the cream solder has a smaller height or a smaller cross-sectional area and is higher in places where the cream solder has a larger height or a larger cross-sectional area. In a place with a lower pressure, the lower pressure is applied to fill the cream solder into the openings 105, resulting in a reduction in the film thickness of cream solder printed on the printed circuit board P. In contrast, in a place with a higher pressure, the higher pressure is applied to fill the cream solder into the openings 105, resulting in an increase in the film thickness of cream solder printed on the printed circuit board P. Thus, when the amount of solder varies at each point in the X direction, the film thickness of the cream solder varies at each point in the X direction, affecting printing quality. In terms of printing performance, the film thickness of the cream solder may be equal to or larger than a specified value. The printing apparatus 10 can make the amount of solder uniform at each point in the X direction and can thus set the film thickness of the cream solder equal to or larger than the specified value and further make the film thickness of the cream solder uniform at each points in the X direction. Hence, high printing quality can be provided.

Embodiment 2

Now, a printing apparatus according to Embodiment 2 of the present invention will be described with reference to FIG. 14. Embodiment 1 calculates the amount Xp of supplied solder at each measurement position P based on the solder width Wp. Embodiment 2 calculates the amount Xp of supplied solder in a manner different from the manner according to Embodiment 1. Otherwise, the configuration of Embodiment 2 is the same as the configuration of Embodiment 1. Thus, only differences from Embodiment 1 will be described.

Embodiment 2 uses a detection sensor 200 (an example of a "measurement section" according to the present invention) which can measure the height H of the remaining solder R, instead of the detection sensor 120. An example of the sensor that can detect the height H of the remaining solder R is a laser displacement meter.

Like the detection sensor 120 according to Embodiment 1, the detection sensor 200 is attached to the solder supply head 80 with a detection surface thereof facing downward. Driving the servo motor M1 or the servo motor M3 allows the detection sensor 200 to move in the X direction or the Y direction integrally with the solder supply head 80.

Figure 14:
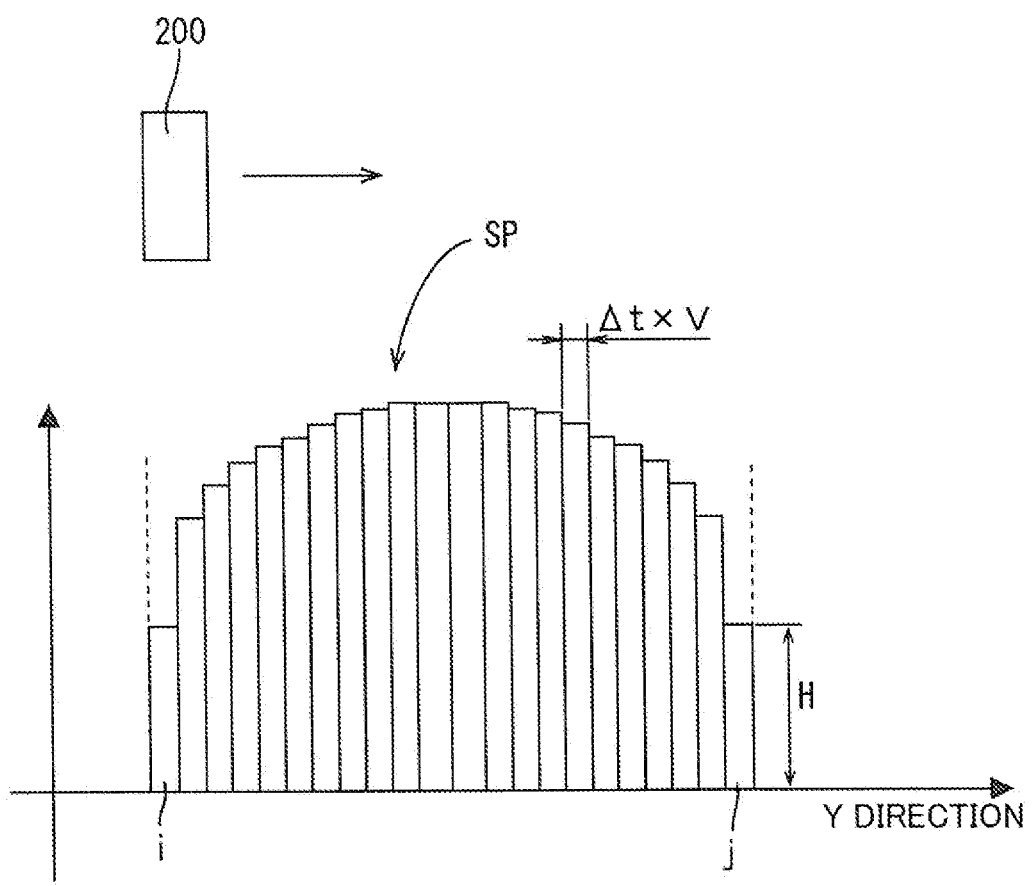
FIG. 14 is a diagram illustrating a method for measuring the cross-sectional area of remaining solder according to Embodiment 2 of the present invention.

In Embodiment 2, for each measurement position P (the points in the X direction), the detection sensor 200 measures the height H of the remaining solder R at a sampling period Δt while being moved in the Y direction, as shown in FIG. 14. Then, based on the data on the height H of the measured remaining solder R at each point (i→j) in the Y direction, the cross-sectional area Sp of the remaining solder R at the measurement position P is calculated in accordance with:

$$Sp = \Sigma H \times \Delta t \times V \qquad \text{Formula (3)}$$

The cross-sectional area of the remaining solder R at the measurement position P is denoted by "Sp".

The sampling period is denoted by "Δt".

The moving speed of the detection sensor 200 in the Y direction is denoted by "V".

Moreover, based on the calculated cross-sectional area Sp, the amount Xp of supplied solder is calculated in accordance with:

$$Xp = (St - Sp) \times \Delta M \qquad \text{Formula (4)}$$

The amount of solder supplied at the measurement position P is denoted by "Xp".

The target cross-sectional area of solder is denoted by "St".

A unit length in the X direction is denoted by "ΔM" (see FIG. 10).

Thus, in Embodiment 2, the controller 150 calculates the amount Xp of supplied solder at each measurement position P based on the cross-sectional area Sp of the remaining solder R. Compared to Embodiment 1, Embodiment 2 enables the amount Xp of supplied solder at each measurement position P to be accurately calculated, allowing the amount of solder to be made uniform in the X direction.

Embodiment 3

Figure 15:
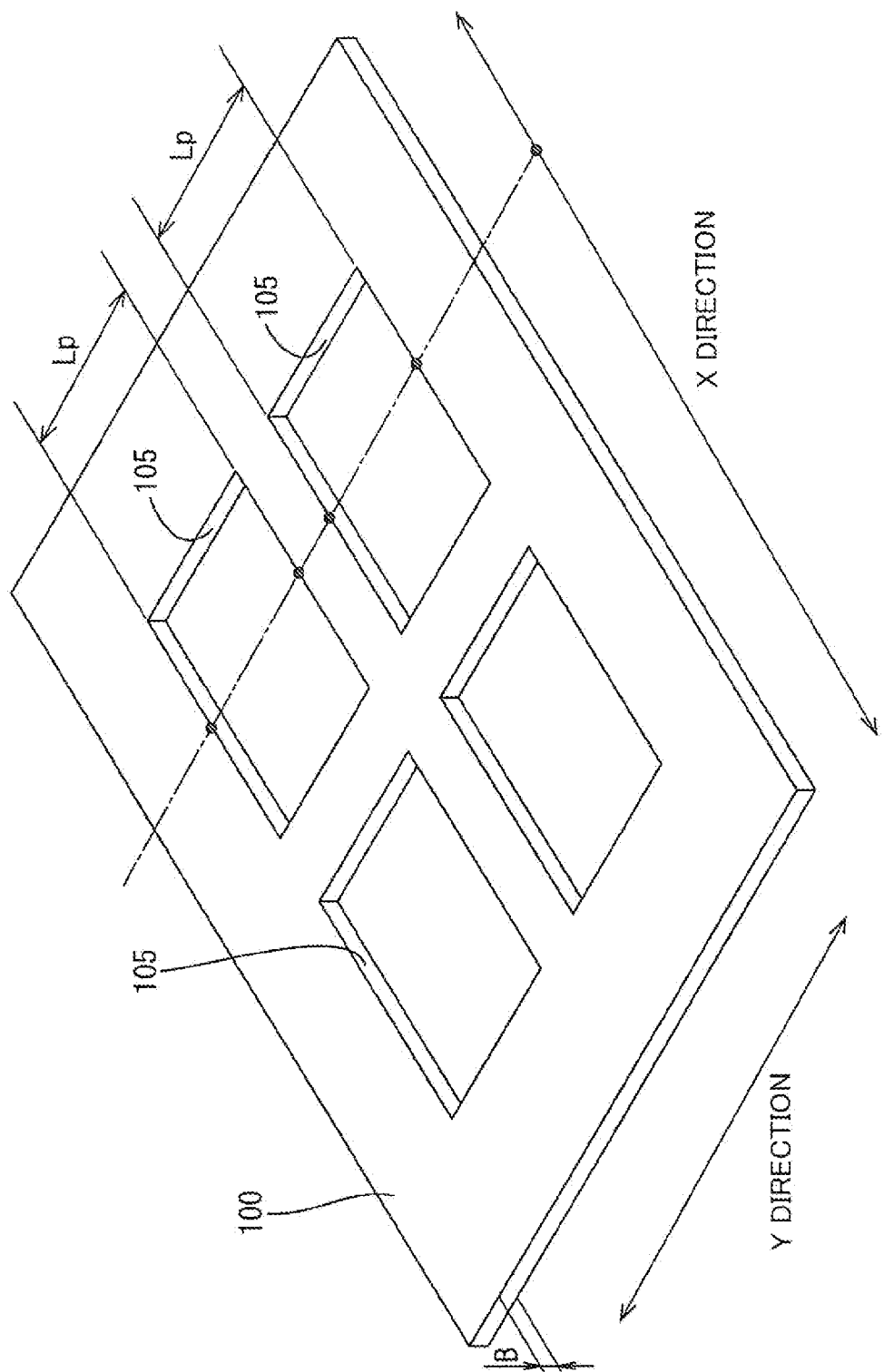
FIG. 15 is a perspective view of a mask sheet according to Embodiment 3 of the present invention.
Figure 16:
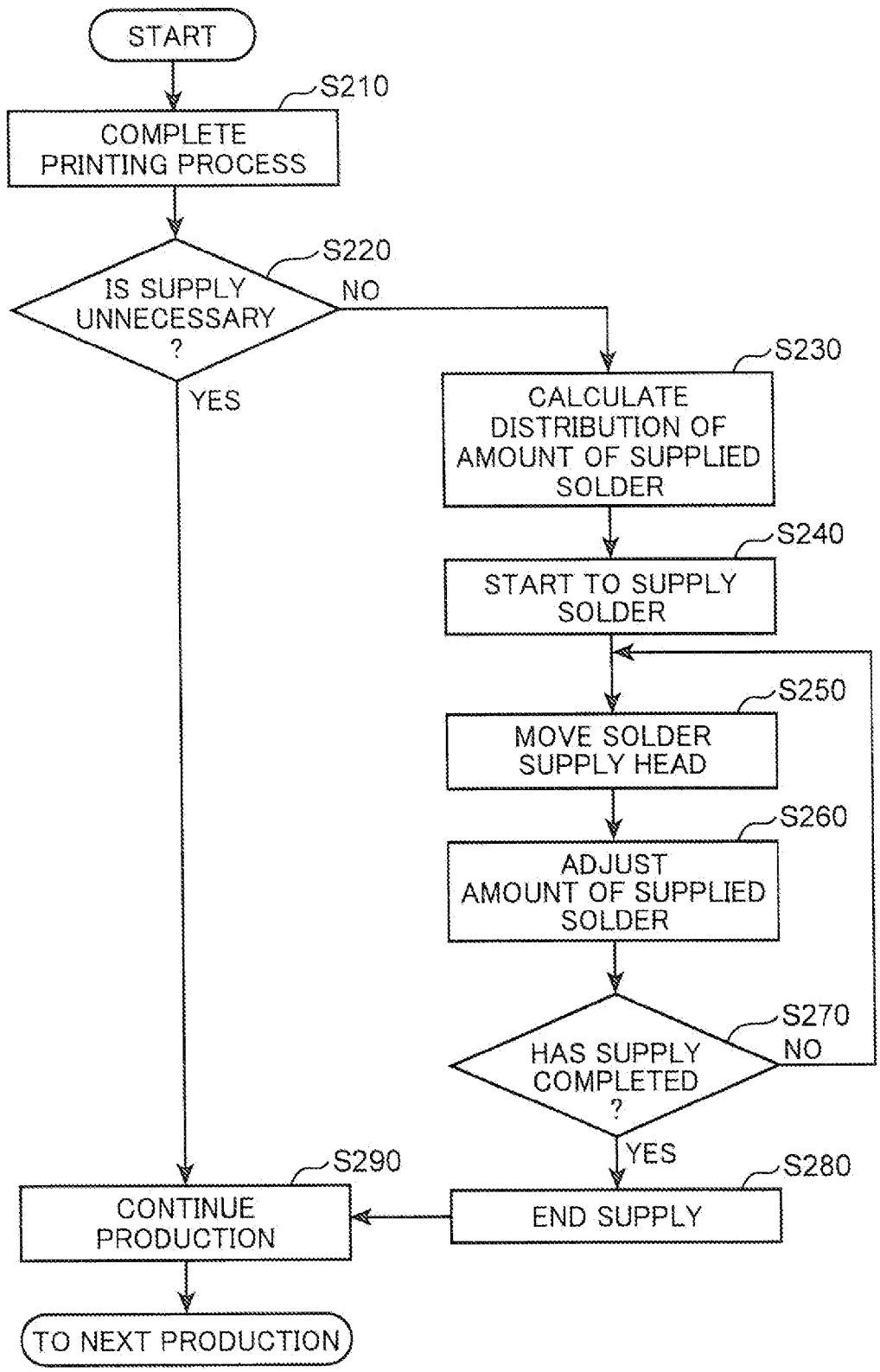
FIG. 16 is a flowchart showing a flow of a process for a replenishment sequence for cream solder.

Now, a printing apparatus according to Embodiment 3 of the present invention will be described with reference to FIG. 15 and FIG. 16. Embodiment 1 and Embodiment 2 calculate the amount Xp of supplied solder based on the measured values from the detection sensors 120 or 200. That is, the amount of decrease in cream solder is determined based on the actually measured data, and an amount of cream solder equivalent to the decrease is supplied.

Embodiment 3 notes that the amount of decrease in solder amount associated with the printing process is equal to the amount of cream solder filled into the openings 105 formed in the mask sheet 100, and Embodiment 3 calculates the amount Gp of decrease in solder amount based on the cross-sectional area Qp of the opening 105 in accordance with Formula (6). The calculated amount Gp of decrease in solder amount is determined to be the amount Xp of supplied solder.

$$Qp = Lp \times B \qquad \text{Formula (5)}$$

$$Gp = Qp \times \Delta M \qquad \text{Formula (6)}$$

$$Xp = Gp \qquad \text{Formula (7)}$$

The amount of decrease in solder amount (=the amount of solder supplied) at the position P in the X direction is denoted by "Gp".

The length of the opening (if a plurality of openings is formed, the total length of the openings) at the position P in the X direction is denoted by "Lp".

The thickness of the mask sheet is denoted by "B".

A unit length in the X direction is denoted by ΔM (see FIG. 10).

If cream solder is printed on a plurality of (for example, two) printed circuit boards U during a single printing operation, the amount of cream solder filled into the openings 105 is increased by a factor equal to the number of printed circuit boards (the factor is 2 when two printed circuit boards are printed). Thus, the amount Gp of decrease in solder amount in Formula (6) described above needs to be increased by the factor equal to the number of printed circuit boards.

Data on the openings 105 formed in the mask sheet 100 can be acquired from the image data on the mask sheet 100 taken with the mask sheet camera 140 or from design data or inspection data on the mask sheet 100.

Now, a replenishment sequence for cream solder will be described with reference to FIG. 16. The printing apparatus 10 starts an automatic operation, and when the first printing process is completed, the remaining solder R remains near the print end position on the mask sheet 100 as shown in FIG. 10 (S210).

In S220, the controller 150 determines whether or not the supply of cream solder is necessary. If the supply is determined to be unnecessary, the process shifts to S290 to continue production, that is, carry out a printing process on the next circuit board. On the other hand, if the supply of cream solder is determined to be necessary, the process shifts to S230.

In S230, the controller 150 carries out a process of calculating the distribution of the amount Xp of supplied solder in the X direction. Specifically, the amount Xp of supplied solder is calculated for each point in the X direction based on Formula (5) to Formula (7) described above. Then, based on the calculated amount Xp of supplied solder at each point in the X direction, the distribution of the amount Xp of supplied solder in the X direction is calculated. The amount Xp of supplied solder at each point in the X direction may be stored in a storage section 153 so that the data can be read and used in S230.

When the process in S230 is finished, the process shifts to S240 to start to carry out a process of supplying cream solder to the remaining solder R on the mask sheet 100. Specifically, the position of the solder supply head 80 is adjusted such that the position of the nozzle 85, through which solder is discharged, coincides with one end (for example, the left end in FIG. 10) of the remaining solder R in the X direction. Subsequently, the remaining solder R is replenished with cream solder by moving the solder supply head 80 toward the other end of the remaining solder R in the X direction while discharging the cream solder from the tip of the nozzle 85. At this time, the controller 150 adjusts the rotation speed of the servo motor M4 according to the distribution of the amount Xp of supplied solder calculated in S230 to adjustably increase or reduce the amount Xp of supplied solder at each point in the X direction (S250 and S260).

When the nozzle of the solder supply head 80 moves to the other end (the right end in FIG. 10), an affirmative determination is made in S270. Subsequently, the process shifts to S280, and the controller 150 carries out a process of stopping the movement of the solder supply head 80 and a process of stopping the supply of cream solder. Thereafter, the process shifts to S290 to start to carry out a printing process on the next circuit board.

As described above, the printing apparatus 10 calculates the amount Xp of supplied solder at each point in the X direction from the amount of solder filled into the openings 105. Thus, the detection sensors 120 and 200 can advantageously be omitted.

Embodiment 4

Figure 17A:
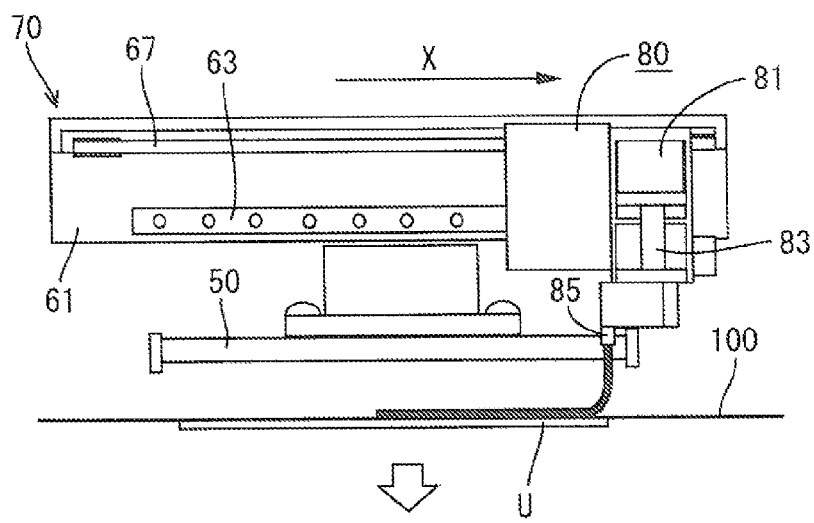
FIGS. 17A to 17C are diagrams showing a printing operation (repeated line-drawing supply) performed by the solder supply head according to Embodiment 4 of the present invention.
Figure 17B:
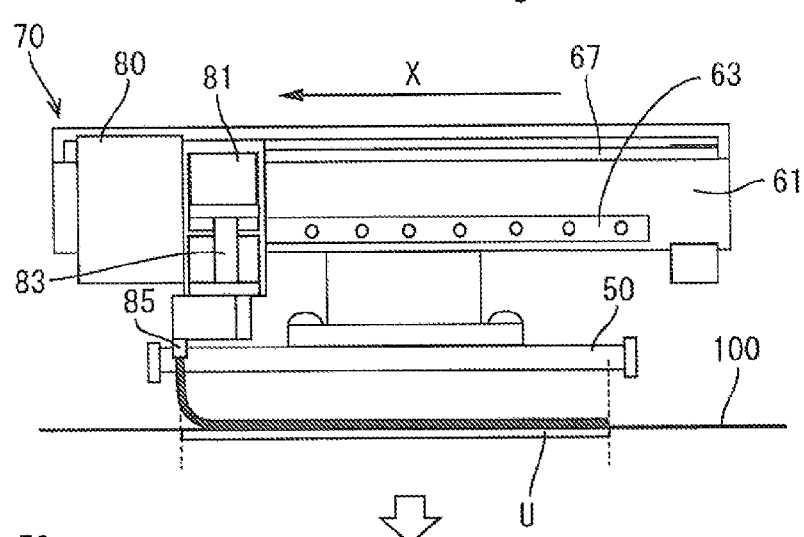
Figure 17C:
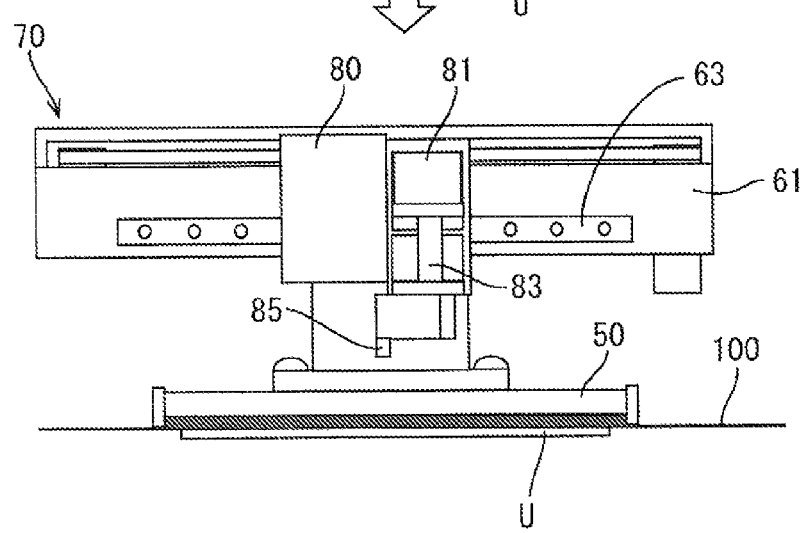

Now, a printing apparatus according to Embodiment 4 of the present invention will be described with reference to FIG. 17A to FIG. 21. Repeated line-drawing supply is a method for supplying cream solder. The repeated drawing supply involves consecutively carrying out a process of supplying cream solder onto the mask sheet 100 while reciprocating the solder supply head 80 in the X direction until the amount of solder supplied reaches a target value as shown in FIG. 17A to FIG. 17C.

However, the repeated line-drawing supply results in a nonuniform solder width immediately after the supply. Thus, a rolling operation is performed which involves forming the whole cream solder into an even shape by reciprocating the squeegee 50 in the Y direction to level off the solder (the leveling-off of the solder using the squeegee 50 is referred to as rolling).

Figure 18:
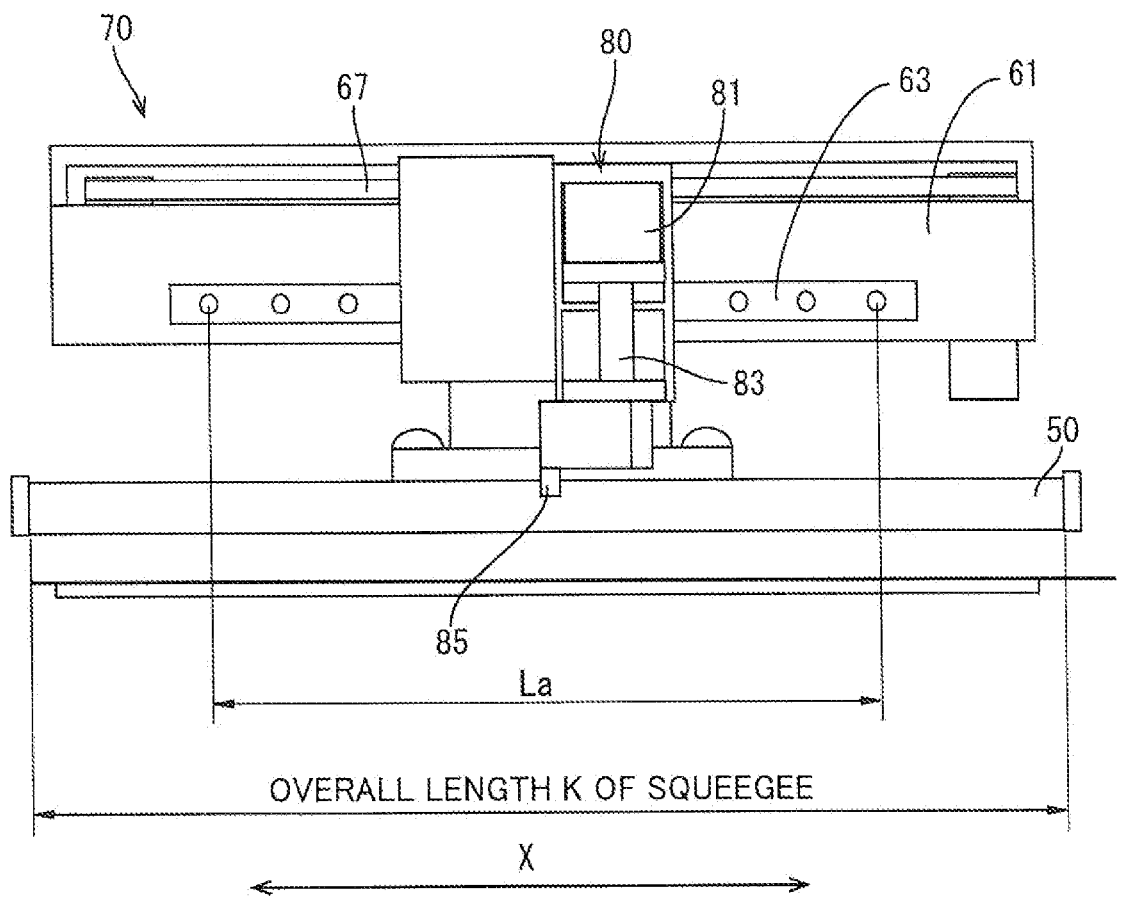
FIG. 18 is a front view of the solder supply unit.
Figure 19:
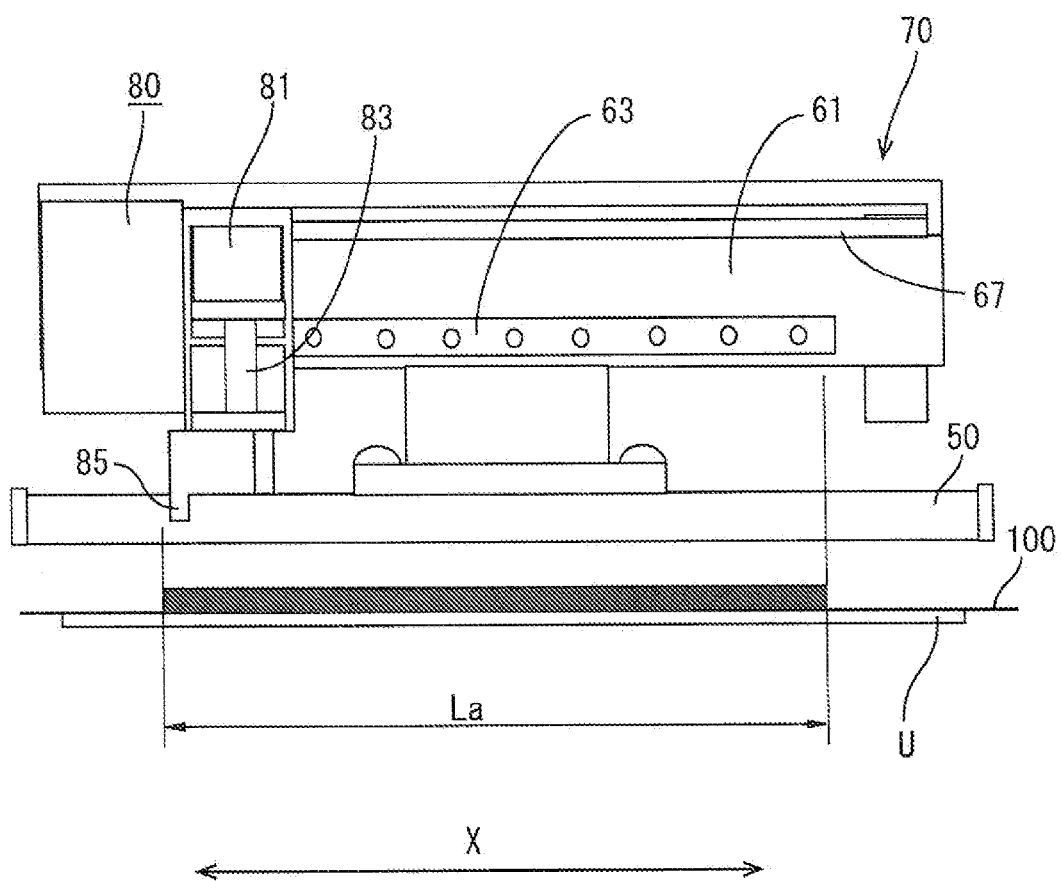
FIG. 19 is a front view of the solder supply unit.

Restrictions on the overall size of the printing apparatus 10 may make the moving range La of the nozzle 85 of the solder supply head 80 smaller than the overall length K of the squeegee 50, as shown in FIG. 18. In this case, the following operation may be used to supply solder all over the squeegee 50: the repeated line-drawing supply is be carried out within the moving range La until the amount of solder supplied reaches the target value (see FIG. 19), and then rolling is performed using the squeegee 50 to spread the supplied solder to the ends of the squeegee.

However, the repeated line-drawing supply supplies cream solder in line form, and thus, the amount of solder is generally equal at each point in the X direction after the supply of solder. Thus, to spread the cream solder to the ends of the squeegee, the whole cream solder supplied onto the mask sheet 100 needs to be drawn in the X direction. This disadvantageously increases the number of rolling operations.

Figure 20:
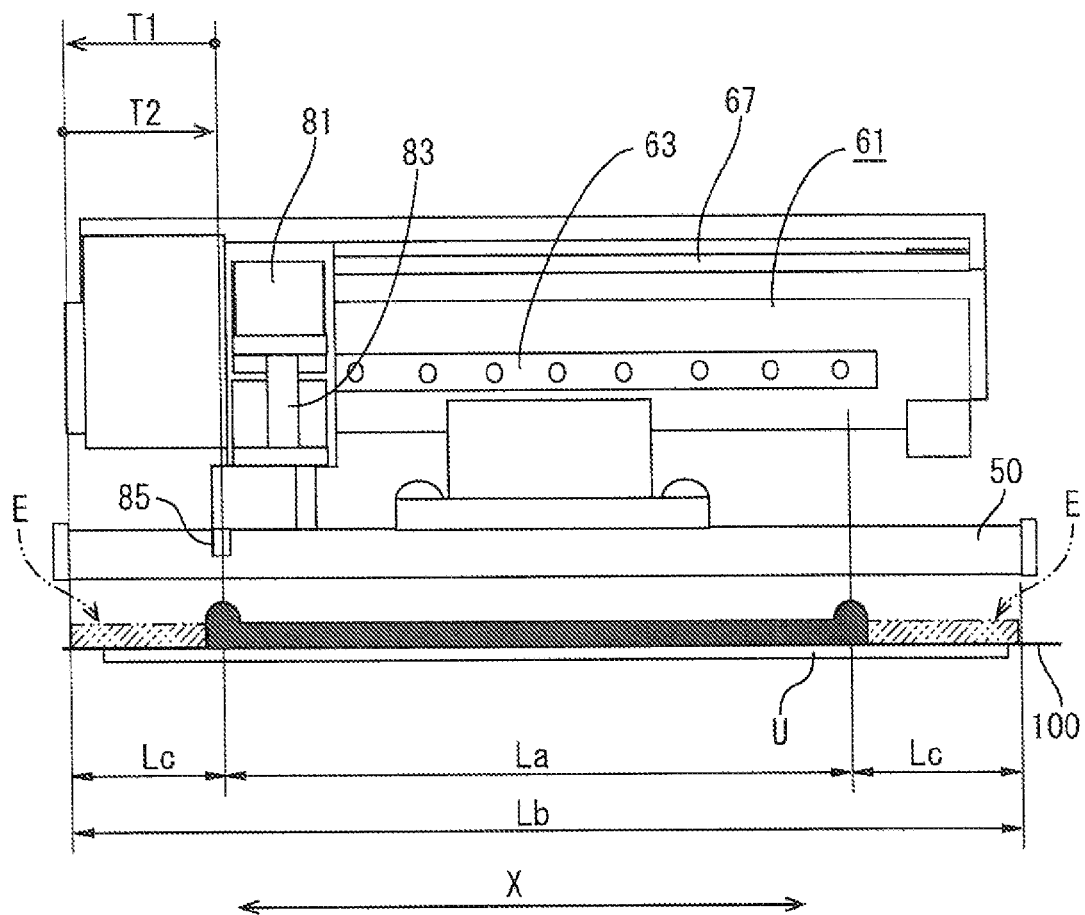
FIG. 20 is a front view of the solder supply unit.

Thus, the printing apparatus 10 supplies a larger amount of solder at the opposite ends of the moving range La (the opposite ends in the X direction) than in places other than the opposite ends as shown in FIG. 20. Supplying more solder at the opposite ends of the moving range La allows the cream solder to spread out easily during rolling. Hence, the solder can be spread to the ends of the squeegee by a reduced number of rolling operations.

The amount of additionally supplied cream solder will be described which is needed to compensate for the difference between the moving range La of the nozzle 85 and the overall length K of the squeegee 50.

Given that a constant amount of solder is discharged through the nozzle 85 per unit time, the amount E of solder insufficiency occurring at the ends of the squeegee can be expressed by the product of the amount M of discharged solder and a time T for reciprocation as indicated in Formula (12) shown below. The time T for reciprocation is a time needed for the nozzle 85 to reciprocate for an insufficiency distance Lc over which the direct supply of solder through the nozzle 85 is prevented.

This will further be described taking, for example, the left end in FIG. 20 as an example. The time T for reciprocation is the sum of a time T1 needed for the nozzle 85 to move from the left end of the moving range La to the left end of a solder supply range Lb calculated from the overall length of the squeegee 50 and a time T2 needed for the nozzle 85 to move from the left end of the solder supply range Lb calculated from the overall length of the squeegee 50 to the left end of the moving range La. The moving speed of the solder supply head 80 in the X direction is denoted by "V".

$Lc=(Lb-La)/2$ Formula (8)

$T1=Lc/V$ Formula (9)

$T2=Lc/V$ Formula (10)

$T=T1+T2$ Formula (11)

$E=M\times T$ Formula (12)

Thus, the amount E of solder insufficiency occurring at the ends of the squeegee can be expressed as the product of the amount M of discharged solder and the time T for reciprocation. Thus, the printing apparatus 10 converts the amount E of solder insufficiency into a time (the time T for reciprocation). The printing apparatus 10 then compensates for the amount E of solder insufficiency occurring at the ends of the squeegee by supplying an excess amount of cream solder while the nozzle 85 is stopped at the opposite ends of the moving range La for the time T for reciprocation.

Figure 21:
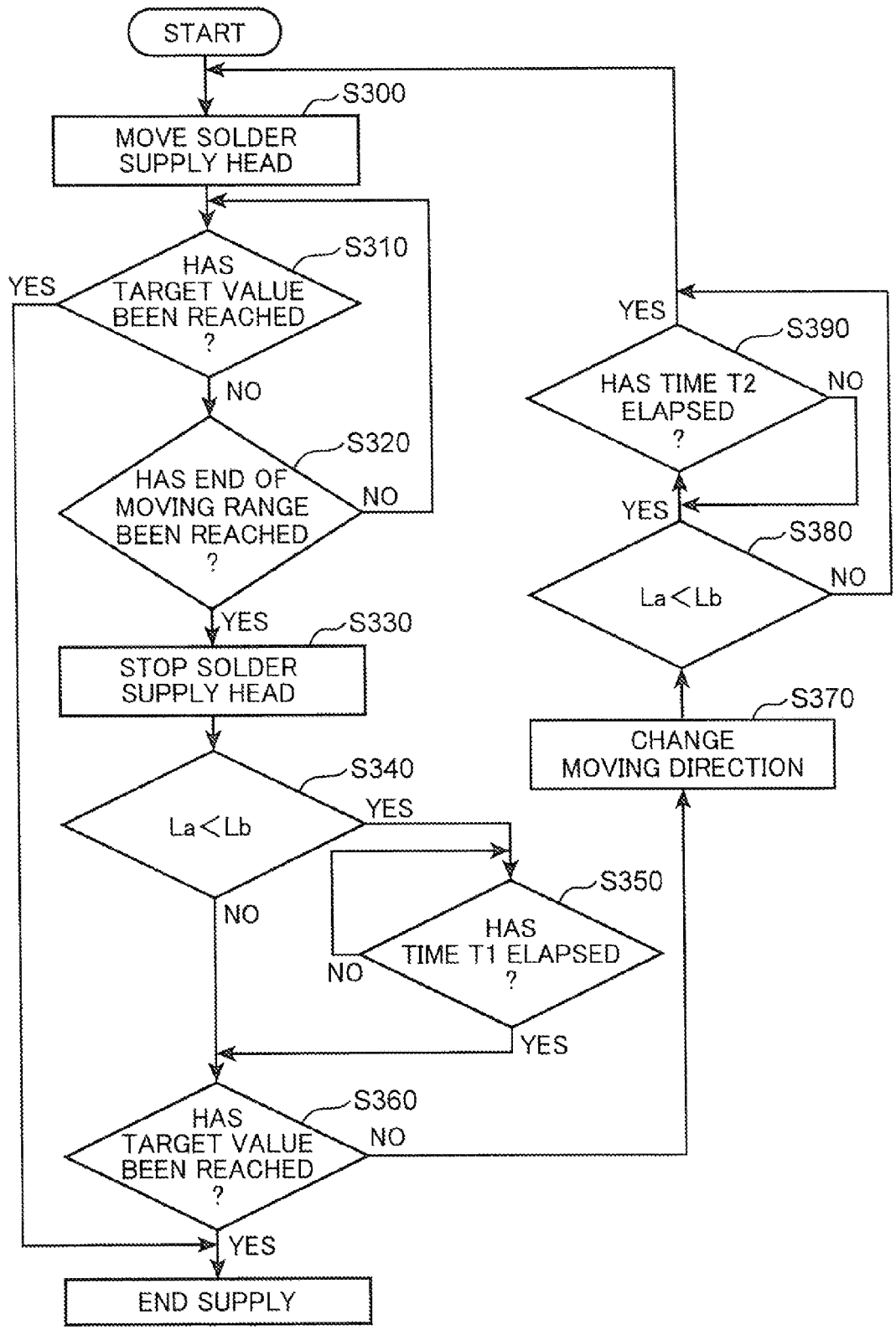
FIG. 21 is a flowchart showing a flow of a process for a solder supply sequence.

A solder supply sequence carried out by the controller 150 will be described based on a flowchart in FIG. 21. The description assumes that the nozzle 85 of the solder supply head 80 is preliminarily located at a central position of the moving range La. Furthermore, data such as the moving range La, the solder supply range Lb, and the moving speed V of the head 80 are preliminarily stored in the storage section 153.

When the solder supply sequence is started, the drive section 90 is actuated to cause the cream solder to be discharged through the tip of the nozzle 85. Subsequently, in S300, the servo motor M3 drives the solder supply head 80 so that the solder supply head 80 starts to move leftward in the X direction. Thus, the nozzle 85 moves leftward in the X direction while discharging the cream solder. Consequently, the cream solder is supplied onto the mask sheet 100 in line form.

Subsequently, the process shifts to S310. In S310, the controller 150 determines whether or not the amount of solder supplied has reached the target value (the total amount of cream solder to be supplied). If the amount of solder supplied has not reached the target value, a negative determination is made in S310. If a negative determination is made in S310, the process shifts to S320. In S320, the controller 150 carries out a process of determining whether or not the nozzle 85 has reached the end (in this case, the left end) of the moving range La. If the end of the moving range La has not been reached, a negative determination is made in S320, and the process returns to S310.

As described above, the determinations in S310 and S320 are repeated after the supply of solder is started and before the nozzle 85 reaches the end of the moving range La. When the nozzle 85 reaches the left end of the moving range La, an affirmative determination is made in S320, and the process shifts to S330. In S330, the controller 150 carries out a process of stopping the driving of the servo motor M3 to stop the solder supply head 80. The process subsequently shifts to S340.

In S340, the controller 150 carries out a process of comparing "La" with "Lb" in terms of magnitude. If the moving range "La" of the nozzle 85 is smaller than the solder supply range "Lb" calculated from the overall length of the squeegee 50, an affirmative determination is made in S340.

If an affirmative determination is made in S340, the controller 150 carries out a process of calculating the time T1 in accordance with Formula (9) described above, and the process subsequently shifts to S350. In S350, the controller 150 carries out a process of determining whether or not the time "T1" has elapsed since the stoppage of the solder supply head 80. Until the time "T1" elapses, a negative determination is made in S350 to set the printing apparatus 10 to a wait state in which the printing apparatus 10 waits for the time T1 to elapse.

Even after the solder supply head 80 is stopped in S330, a process of discharging the solder through the nozzle 85 is continued. Thus, cream solder continues to be supplied to the left end of the moving range "La" through the nozzle 85. Subsequently, when the time "T1" elapses, an affirmative determination is made in S350, and thus, the process shifts to S360. In S360, the controller 150 carries out a process of determining whether or not the amount of solder supplied has reached the target value (the total amount of cream solder to be supplied). If the target value has not been reached, a negative determination is made in S360. If a negative determination is made in S360, the process shifts to S370.

In S370, the controller 150 carries out a process of changing the moving direction of the solder supply head 80. In this case, the original moving direction is a leftward direction, and thus, the moving direction is changed and set to a rightward direction. At this point of time, only the change in moving direction is effected, and the nozzle 85 of the solder supply head 80, stopped in S330, remains stopped at the left end of the moving range "La".

Subsequently, the process shifts to S380. S380 corresponds to the same process as that in S340, and involves a process of comparing "La" with "Lb" in terms of magnitude. If the moving range La of the nozzle 85 is smaller than the solder supply range Lb calculated from the overall length of the squeegee 50, an affirmative determination is made in S380.

If an affirmative determination is made in S380, the controller 150 carries out a process of calculating the time T2 in accordance with Formula (10) described above, and the process subsequently shifts to S390. In S390, the controller 150 carries out a process of determining whether or not the time "T2" has elapsed. Until the time "T2" elapses, a negative determination is made in S390 to set the printing apparatus 10 to a wait state in which the printing apparatus 10 waits for the time T2 to elapse. Even during the wait state, a process of discharging the solder through the nozzle 85 is continued. Thus, cream solder continues to be supplied to the left end of the moving range "La" through the nozzle 85.

As described above, when the cream solder continues to be discharged for a time (T1+T2) with the nozzle 85 stopped at the left end of the moving range "La", the amount E of solder insufficiency occurring at the left end of the squeegee 50 can be compensated for. For the times "T1" and "T2", pre-calculated data may be stored in the storage section 153 and read for use in S340 and S390.

When the time "T2" elapses, an affirmative determination is made in S390 to shift the process to S300. In S300, the controller 150 controllably re-drives the servo motor M3 to now move the solder supply head 80 rightward in the X direction. Thus, the nozzle 85 moves rightward in the X direction while discharging the cream solder. Subsequently, once the nozzle 85 reaches the right end of the moving range "La", the cream solder continues to be discharged for the time (T1+T2) with the nozzle 85 stopped at the right end of the moving range "La", as described above. Hence, the amount E of solder insufficiency occurring at the right end of the squeegee 50 can be compensated for.

Such a process is repeated, and when the amount of solder supplied reaches the target value, an affirmative determination is made in either S310 or S360. When an affirmative determination is made in S310 or S360, the solder supply process ends.

The controller 150 stops the nozzle 85 at the positions of the opposite ends of the moving range La and supplies cream solder such that the amount of cream solder supplied at the opposite ends is larger than in the other places by the amount E of solder insufficiency. Thus, "the change unit (controller)" according to the present invention implements a process of "changing the amount of solder supplied at the opposite ends of the moving range (increasing the amount above the amounts in the other places) by keeping the nozzle stopped while discharging the solder through the nozzle at the opposite ends of the moving range for a time corresponding to the amount of solder insufficiency".

As described above, Embodiment 4 increases the amount of solder supplied at the opposite ends of the moving range "La" above the amounts of supplied solder in the other places. Supplying more solder at the opposite ends of the moving range "La" allows the cream solder to spread out easily during rolling. Hence, the solder can be spread to the ends of the squeegee by a reduced number of rolling operations.

Other Embodiments

The present invention is not limited to the embodiments illustrated by the description and the drawings. For example, the following embodiments are included within the technical scope of the present invention.

(1) Embodiment 1 takes, as an example of the solder supply head 80, the type using the servo motor M4 as a drive source. A power source for the solder supply head 80 is not limited to the motor but may utilize air pressure. That is, as shown in FIG. 22, air is externally supplied to a syringe 400 filled with cream solder to press a piston 410 downward which is provided in the syringe 400, thus causing the cream solder to be discharged through a discharge port provided at the bottom of the syringe. In this case, the amount of solder supplied may be adjusted by using a regulator 430 to regulate the pressure of a plenum chamber 420 in the cylinder. That is, in order to increase the amount of solder supplied, the air pressure of the plenum chamber 420 is increased. In order to reduce the amount of solder supplied, the air pressure of the plenum chamber 420 is reduced.

(2) Embodiment 1 takes stencil (metal mask) as an example of the mask sheet 100, but a mesh screen may be used.

(3) Embodiment 1 takes the reciprocation of the squeegee 50 in the Y direction as an example of the printing process, but a forward operation and a backward operation may each be a single printing process.

The above-described specific embodiments mainly include inventions configured as described below.

An aspect of the present invention provides a solder supply method of supplying, onto a mask sheet, solder to be printed on a printed circuit board, the method including calculating an amount of solder supplied for a plurality of points in an X direction that is a lengthwise direction of a squeegee, and changing the amount of solder supplied at each point in the X direction based on a result of the calculation.

The solder supply method changes the amount of solder supplied at each point in the X direction, thus allowing the amount of solder to be more accurately adjusted.

An aspect of the present invention provides a solder supply apparatus that supplies, onto a mask sheet, solder to be printed on a printed circuit board, the apparatus including a calculation unit that calculates an amount of solder supplied for a plurality of points in an X direction that is a lengthwise direction of a squeegee, and a change unit that changes the amount of solder supplied at each point in the X direction based on a result of the calculation by the calculation unit.

The solder supply apparatus changes the amount of solder supplied at each point in the X direction, thus allowing the amount of solder to be more accurately adjusted.

The "calculation of the amount of solder supplied" includes not only the actual calculation of the amount of solder supplied but also a calculation based on a conversion of the amount of solder supplied into a time.

Preferred embodiments of the present invention are as follows.

When a moving direction of the squeegee is defined as a Y direction, a process of measuring a solder width, in the Y direction, of the solder remaining on the mask sheet is carried out at each point in the X direction after a process of printing the solder, and the amount of solder supplied at each point in the X direction is calculated based on the measured solder width at each point in the X direction.

When a moving direction of the squeegee is defined as a Y direction, a process of measuring a height, at each point in the Y direction, of the solder remaining on the mask sheet is carried out at each point in the X direction after a process of printing the solder, a process of calculating a cross-sectional area of the remaining solder based on the measured height at each point in the Y direction is carried out at each point in the X direction, and the amount of solder supplied at each point in the X direction is calculated based on the calculated cross-sectional area at each point in the X direction.

Measurement positions in the X direction which conform to a predetermined measurement condition are determined based on inspection data on the mask sheet, and the solder width or the height at each point in the Y direction is measured for the determined measurement positions. A variation in solder width or cross-sectional area in the X direction can be accurately detected.

An amount of decrease in solder amount at each point in the X direction, which is associated with a printing process, is calculated based on a cross-sectional area of an opening formed in the mask sheet, and the amount of solder supplied at each point in the X direction is determined based on the calculated amount of decrease in solder amount. The amount of solder supplied can be simply computationally determined without the use of a detection sensor.

A discharge pressure for the solder is adjusted to change the amount of solder supplied at each point in the X direction. The amount of solder supplied can be changed without a reduction in the moving speed of the solder supply head.

A speed at which a solder supply head configured to supply solder moves in the X direction is adjusted to change the amount of solder supplied at each point in the X direction. The amount of solder supplied can be changed simply by adjusting the moving speed.

When a moving range of a nozzle which is provided in a solder supply head configured to supply solder and through which the solder is discharged is shorter than a length of the squeegee, the amount of solder insufficiency at opposite ends of the moving range is calculated based on an insufficiency of the moving range of the nozzle relative to the length of the squeegee and a moving speed of the solder supply head. Solder is supplied in such a manner that the amount of solder supplied at the opposite ends of the moving range of the nozzle is larger than the amount of solder supplied in other places, by the amount of solder insufficiency. This enables a reduction in the number of rolling operations. The "calculation of the amount of solder insufficiency" includes not only the actual calculation of the amount of solder insufficiency but also a calculation based on a conversion of the amount of solder insufficiency into a time.

An amount of solder corresponding to the amount of solder insufficiency is supplied at the opposite ends of the moving range by keeping the nozzle stopped while discharging the solder through the nozzle for a time corresponding to the amount of solder insufficiency.

The embodiments of the present invention as described above enable the amount of solder to be more accurately adjusted. Furthermore, the number of rolling operations can be reduced.

This application is based on Japanese Patent application serial No. 2012-241095 filed in Japan Patent Office on Oct. 31, 2012, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A solder supply method for a printing apparatus which includes a solder supply nozzle, a mask sheet, and a squeegee extending in an X-direction that is a lengthwise direction thereof such that, under control of a controller, solder is supplied onto the mask sheet via the solder supply nozzle and the squeegee is moved on the mask sheet along a Y-direction perpendicular to the X-direction so that solder is to be printed on a printed circuit board placed underneath the mask sheet, the method comprising:

(A) causing a detection sensor to detect an amount of a remaining solder remaining on the mask sheet for a plurality of points in the X direction of the squeegee after a first process of printing the solder and before a second process of printing the solder, (B) causing the controller to calculate an amount of solder to be supplied on the mask sheet for a plurality of points in the X direction based on a detecting result of the detection sensor;

(C) causing the controller to change the amount of solder supplied at each point on the mask sheet in the X direction from the solder supply nozzle based on a result of the calculation, and (D) causing the solder supply nozzle to supply solder with an amount corresponding to a result of the change on the mask sheet for preparation of the second process of printing the solder.

2. The solder supply method according to claim 1, wherein:

causing the detection sensor to measure a solder width, in a Y direction, of the solder remaining on the mask sheet, at each point in the X direction, the Y direction being defined as a moving direction of the squeegee, and causing the controller to calculate the amount of solder supplied at each point in the X direction by comparing the measured solder width at each point in the X direction with a predetermined target value for a remaining solder width, the point in the X direction being a point with a measured solder width that is smaller than the target value.

3. The solder supply method according to claim 2, wherein measurement positions in the X direction which conform to a predetermined measurement condition are determined based on inspection data on the mask sheet, and the solder width is measured for the determined measurement positions.

4. The solder supply method according to claim 1, wherein:
- causing the detection sensor to measure a height, at each point in a Y direction, of the solder remaining on the mask sheet, at each point in the X direction, the Y direction being defined as a moving direction of the squeegee;
- causing the controller, at each point in the X direction, to calculate a cross-sectional area of the remaining solder based on the measured height at each point in the Y direction, and
- causing the controller to calculate the amount of solder supplied at each point in the X direction by comparing the calculated cross-sectional area at each point in the X direction with a predetermined target value for a cross-sectional area of the remaining solder, the point in the X direction being a point with a calculated cross-sectional area that is smaller than the target value.

5. The solder supply method according to claim 4, wherein measurement positions in the X direction which conform to a predetermined measurement condition are determined based on inspection data on the mask sheet, and the height at each point in the Y direction is measured for the determined measurement positions.

6. A solder supply method for a printing apparatus which includes a solder supply nozzle, a mask sheet, and a squeegee extending in an X-direction that is a lengthwise direction thereof such that, under control of a controller, solder is supplied onto the mask sheet via the solder supply nozzle and the squeegee is moved on the mask sheet along a Y-direction perpendicular to the X-direction so that solder is to be printed on a printed circuit board placed underneath the mask sheet, the method comprising:
(E) causing the controller to calculate an amount of decrease in solder amount at each point in the X direction, which is associated with a first process of printing the solder, based on a cross-sectional area of an opening formed in the mask sheet after the first process of printing the solder and before a second process of printing the solder,
(F) causing the controller to calculate an amount of solder to be supplied on the mask sheet for a plurality of points in the X direction based on a result of the calculation;
(G) causing the controller to change the amount of solder supplied at each point on the mask sheet in the X direction from the solder supply nozzle based on a result of the calculation, and
(H) causing the solder supply nozzle to supply solder with an amount corresponding to a result of the change on the mask sheet for preparation of the second process of printing the solder.

7. The solder supply method according to claim 1, wherein a discharge pressure for the solder is adjusted to change the amount of solder supplied at each point in the X direction.

8. The solder supply method according to claim 1, wherein a speed at which a solder supply head configured to supply solder moves in the X direction is adjusted to change the amount of solder supplied at each point in the X direction.

9. The solder supply method according to claim 1, further comprising:
- when a moving range of a nozzle which is provided in a solder supply head configured to supply solder and through which the solder is discharged is shorter than a length of the squeegee,
- causing the controller to calculate an amount of solder insufficiency at opposite ends of the moving range based on an insufficiency of the moving range of the nozzle relative to the length of the squeegee and a moving speed of the solder supply head; and
- supplying solder in such a manner that the amount of solder supplied at the opposite ends of the moving range of the nozzle is larger than the amount of solder supplied in other places, by the amount of solder insufficiency.

10. The solder supply method according to claim 9, wherein an amount of solder corresponding to the amount of solder insufficiency is supplied at the opposite ends of the moving range by keeping the nozzle stopped while discharging the solder through the nozzle for a time corresponding to the amount of solder insufficiency.

* * * * *